(12) United States Patent
Elsherbini et al.

(10) Patent No.: US 10,468,578 B2
(45) Date of Patent: Nov. 5, 2019

(54) PACKAGE SUBSTRATES WITH TOP SUPERCONDUCTOR LAYERS FOR QUBIT DEVICES

(71) Applicant: Intel Corporation, Santa Clara, CA (US)

(72) Inventors: Adel A. Elsherbini, Chandler, AZ (US);
Javier A. Falcon, Chandler, AZ (US);
Roman Caudillo, Portland, OR (US);
James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/899,918

(22) Filed: Feb. 20, 2018

(65) Prior Publication Data
US 2019/0044047 A1   Feb. 7, 2019

(51) Int. Cl.
*H01L 39/04* (2006.01)
*H01L 39/02* (2006.01)
*H01L 39/24* (2006.01)
*H01L 39/22* (2006.01)
*G06N 10/00* (2019.01)
*H01L 23/00* (2006.01)
*H01L 23/498* (2006.01)

(52) U.S. Cl.
CPC .......... *H01L 39/045* (2013.01); *G06N 10/00* (2019.01); *H01L 23/49888* (2013.01); *H01L 24/10* (2013.01); *H01L 39/025* (2013.01); *H01L 39/223* (2013.01); *H01L 39/2493* (2013.01)

(58) Field of Classification Search
CPC . H01L 39/045; H01L 39/025; H01L 39/2493; H01L 39/223
See application file for complete search history.

(56) References Cited

U.S. PATENT DOCUMENTS

2018/0013052 A1\*   1/2018   Oliver ................. H01L 25/0657
2018/0102470 A1\*   4/2018   Das .................... H01L 23/49888

OTHER PUBLICATIONS

"Independent, extensible control of same-frequency superconducting qubits by selective broadcasting," Asaad et al., Netherlands Organisation for Applied Scientific Research, Aug. 28, 2015, 17 pages.

(Continued)

*Primary Examiner* — Dung A. Le
(74) *Attorney, Agent, or Firm* — Patent Capital Group

(57) ABSTRACT

An exemplary superconducting qubit device package includes a qubit die housing a superconducting qubit device that includes at least one resonator, and a package substrate, each having a first face and an opposing second face. The resonator is disposed on the first face of the qubit die. The first face of the qubit die faces and is attached to the second face of the package substrate by first level interconnects. The second face of the package substrate includes a superconductor facing at least portions of the resonator. Such a package architecture may advantageously allow reducing design complexity and undesired coupling, enable inclusion of larger numbers of qubit devices in the qubit die of the package, reduce potential negative impact of the materials used in the package substrate on resonator performance, and limit some sources of qubit decoherence.

25 Claims, 13 Drawing Sheets

(56) References Cited

OTHER PUBLICATIONS

"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Surface loss simulations of superconducting coplanar waveguide resonators," Wenner et al, Applied Physics Letters 99, 113513 (2011), pp. 113513-1 through 3.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Scalable quantum circuit and control for a superconducting surface code," Versluis et al, Netherlands Organisation for Applied Scientific Research, Dec. 28, 2016, 9 pages.
"Suspending superconducting qubits by silicon micromachining," Chu et al., Department of Applied Physics, Yale University, Jun. 10, 2016, 10 pages.

\* cited by examiner

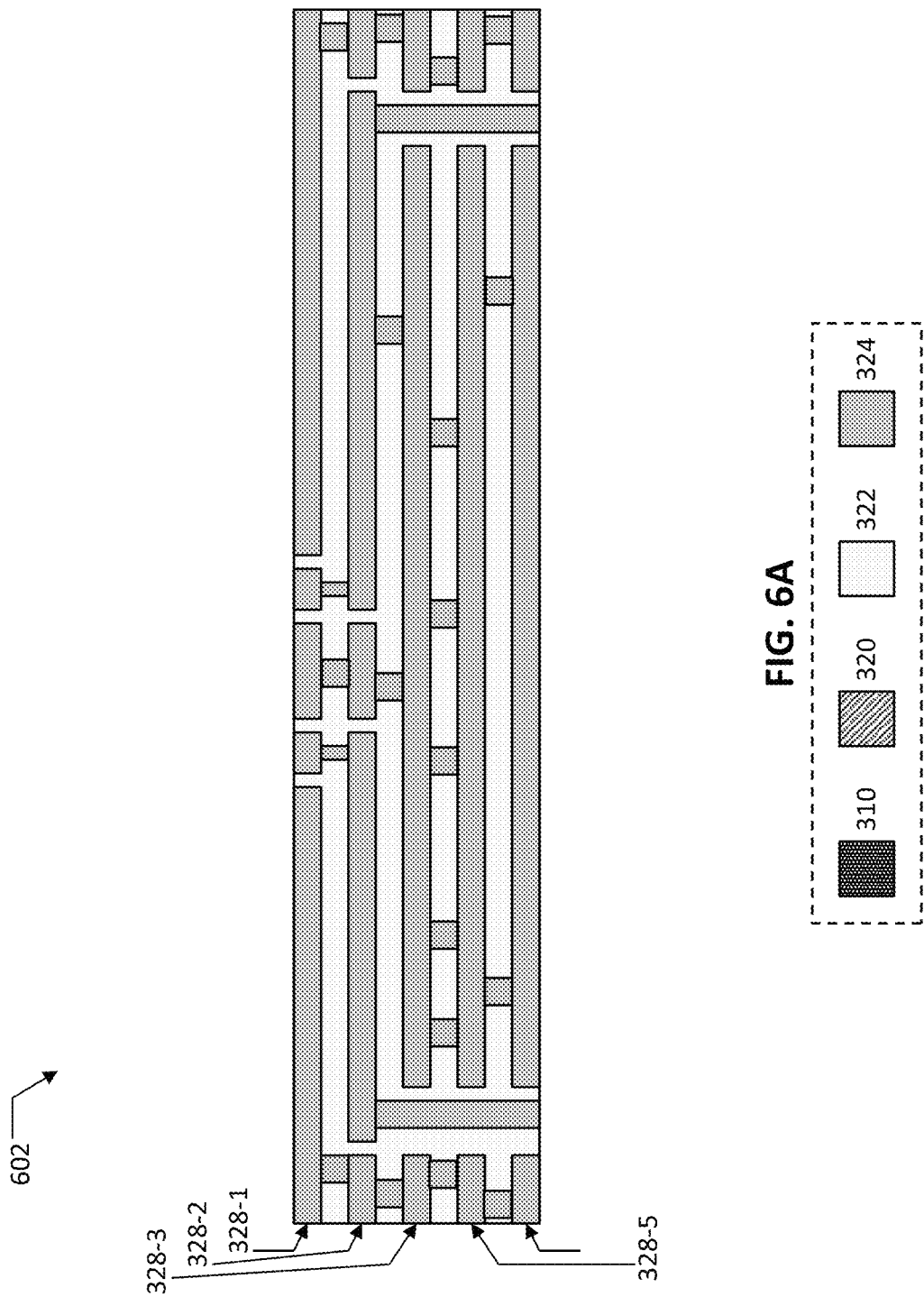

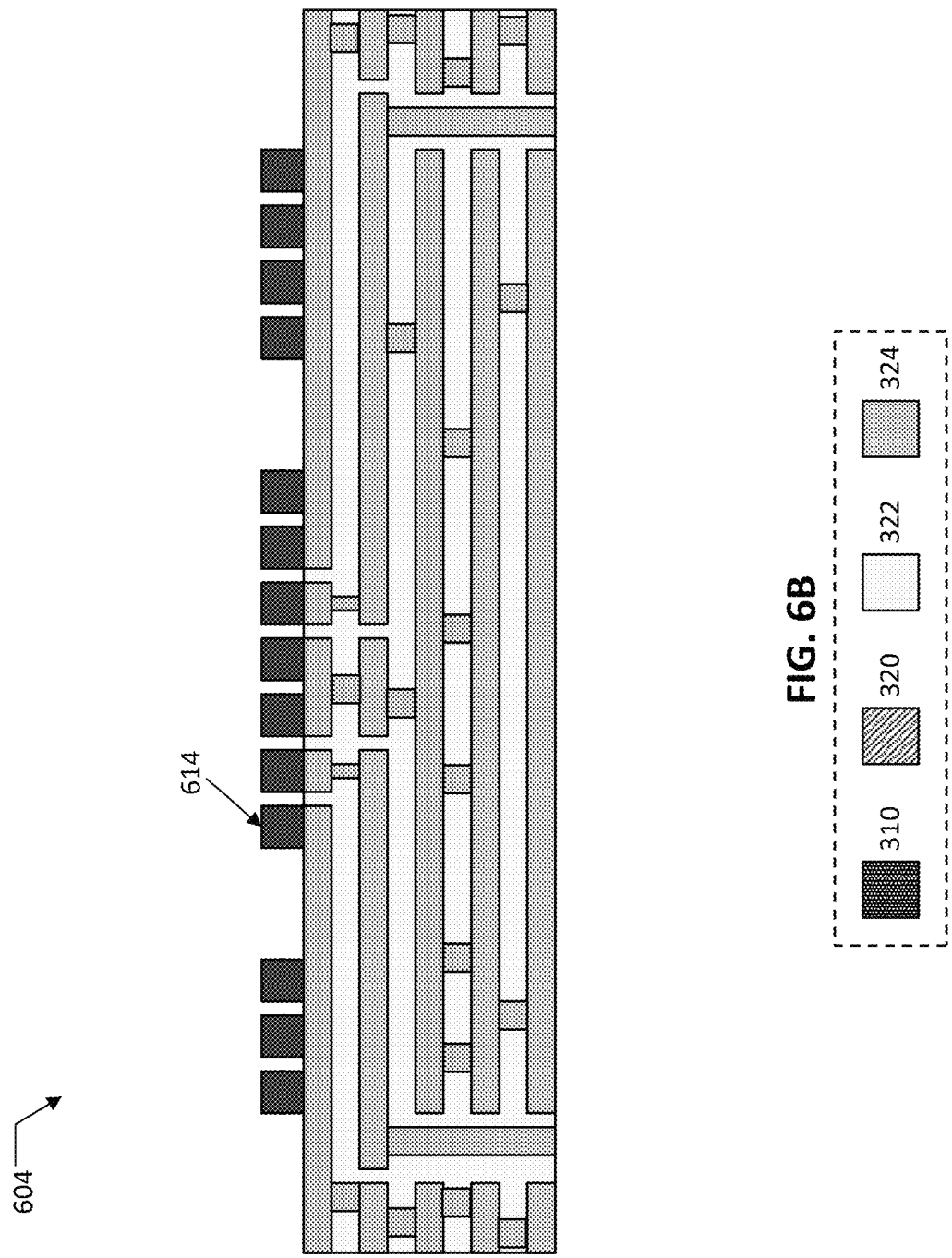

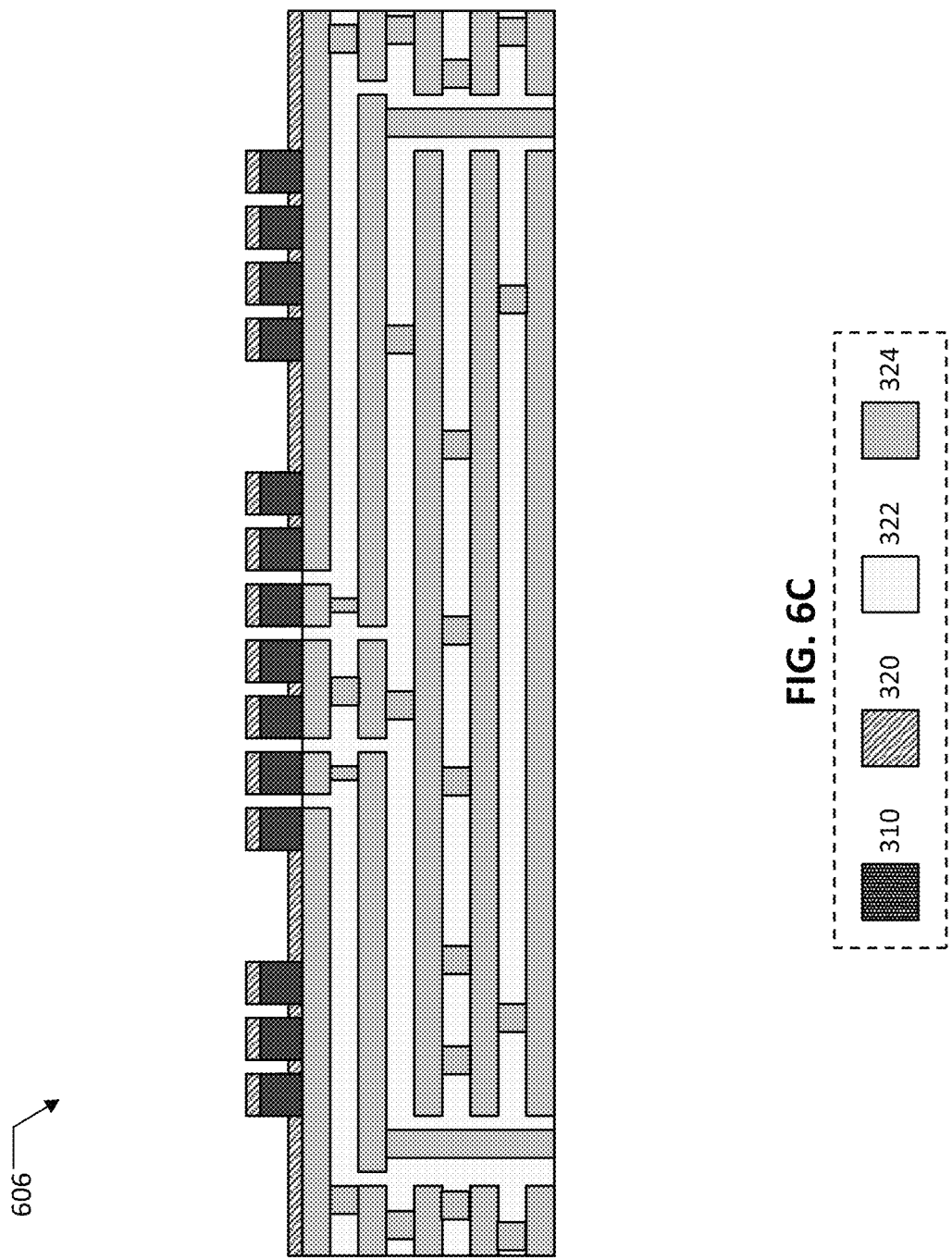

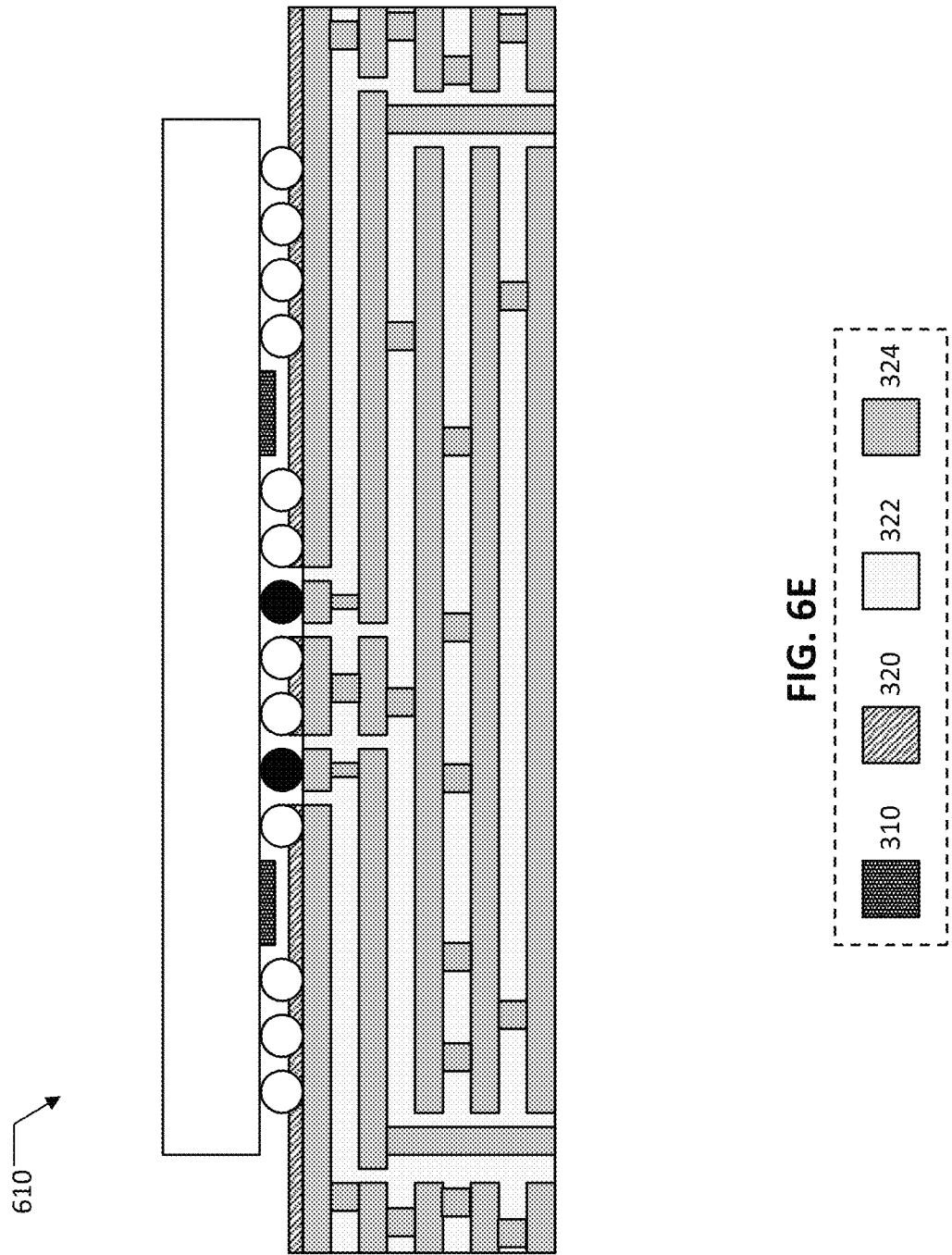

PACKAGE SUBSTRATES WITH TOP SUPERCONDUCTOR LAYERS FOR QUBIT DEVICES

TECHNICAL FIELD

This disclosure relates generally to the field of quantum computing, and more specifically, to package substrates for use with quantum circuit/qubit devices.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a non-trivial task because the unique quantum mechanical phenomena in such circuits lead to unique considerations which never had to be dealt with in classical, non-quantum, circuits, such as e.g. taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance also grows.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 6A-6E illustrate various exemplary stages in the manufacture of a qubit device package assembly using the method shown in FIG. 5, in accordance with various embodiments of the present disclosure.

DETAILED DESCRIPTION

Overview

Figure 1:
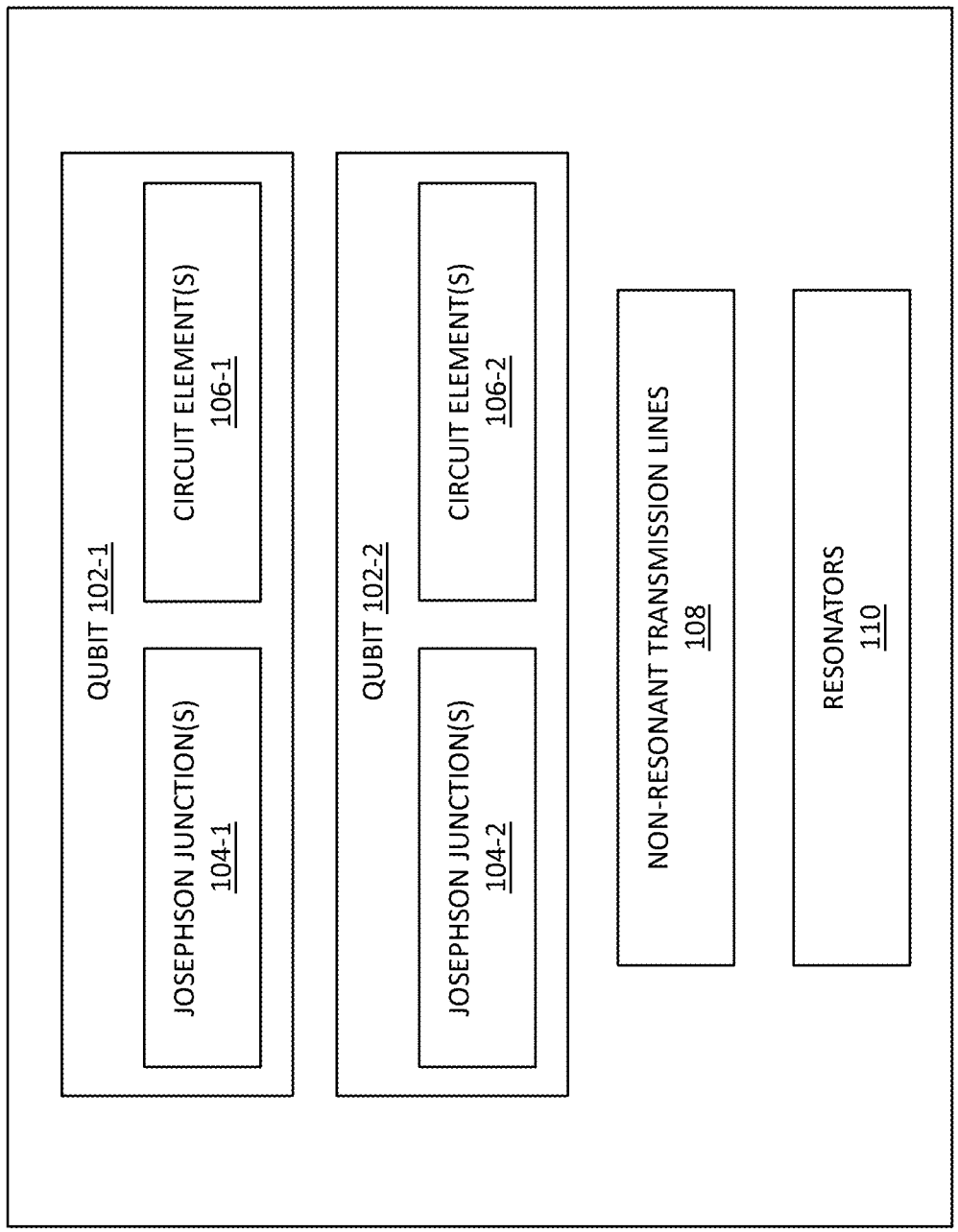
FIG. 1 provides a schematic illustration of an exemplary quantum circuit implementing superconducting qubits, according to some embodiments of the present disclosure.

As briefly described above, quantum computing, or quantum information processing, refers to the field of research related to computation systems that use quantum-mechanical phenomena to manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles being generated or interacting in such a way that the state of one particle becomes intertwined with that of the others. Furthermore, the quantum state of each particle cannot be described independently. Instead, the quantum state is given for the group of entangled particles as a whole. Yet another example of quantum-mechanical phenomena is sometimes described as a "collapse" because it asserts that when we observe (measure) particles, we unavoidably change their properties in that, once observed, the particles cease to be in a state of superposition or entanglement (i.e. by trying to ascertain anything about the particles, we collapse their state).

Put simply, superposition postulates that a given particle can be simultaneously in two states, entanglement postulates that two particles can be related in that they are able to instantly coordinate their states irrespective of the distance between them in space and time, and collapse postulates that when one observes a particle, one unavoidably changes the state of the particle and its' entanglement with other particles. These unique phenomena make manipulation of data in quantum computers significantly different from and significantly more challenging than that of classical computers (i.e. computers that use phenomena of classical physics). In addition, as briefly described above, protecting qubits from decoherence also remains to be a challenge. For this reason, materials, structures, and fabrication methods used for building quantum circuits continuously focus on reducing spurious (i.e. unintentional and undesirable) two-level systems (TLS's), thought to be the dominant source of qubit decoherence, where, in general, as used in quantum mechanics, a two-level (also referred to as "two-state") system is a system that can exist in any quantum superposition of two independent and physically distinguishable quantum states.

As the foregoing illustrates, ability to manipulate and read out quantum states, making quantum-mechanical phenomena visible and traceable, and ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include e.g. superconducting qubits, single trapped ion qubits, Silicon (Si) quantum dot qubits, photon polarization qubits, etc.

Out of the various physical implementations of qubits listed above, superconducting qubits are promising candidates for building a quantum computer. Superconducting qubits operate based on the Josephson effect, which refers to a macroscopic quantum phenomenon of supercurrent, i.e. a current that, due to zero electrical resistance, flows indefinitely long without any voltage applied, across a device known as a Josephson Junction. Josephson Junctions are integral building blocks in quantum circuits employing superconducting qubit devices, forming the basis of quantum circuit elements that can approximate functionality of theoretically designed qubits.

Another type of integral building blocks in superconducting qubit devices are resonators used to couple qubits together and to readout the state of qubits. In general, a resonator of a quantum circuit is a transmission line, typically a microwave transmission line, deliberately designed to support resonant oscillations (i.e. resonance) within the line, under certain conditions, i.e. a resonator may be viewed as a resonant transmission line).

Packaging quantum devices implementing superconducting qubits, i.e. arranging a qubit die that houses a quantum circuit having one or more superconducting qubit devices with a package substrate intended to provide mechanical support in order to prevent physical damage and corrosion of the qubit die, and to support electrical connectivity of the qubit die to further components, e.g. circuit boards or external control electronics, is not an easy task. In particular, great care must be taken to minimize various sources for qubit decoherence and to minimize unintended coupling between various elements which can impact the gate fidelities and further impact the coherence. Conventionally, superconducting qubit devices have been packaged using wirebond packages. In wirebond packages, the qubits are placed on a qubit die facing away from a package substrate and the electrical connections to and from the qubit die are done using wirebonds at the periphery of the die. While, advantageously, such an approach has a minimal impact on the qubits because the qubits are relatively far away from the package substrate, electrical signals have to be routed to the edges of the die which results in more complex designs and often leads to undesired coupling. Furthermore, for larger number of qubits, the die perimeter, and consequently its size, has to grow significantly to allow sufficient connections with good isolations, something that is not compatible with large-scale manufacturing envisioned for the future of quantum computing devices. Additionally, with standard wirebonding technologies, spurious resonances due to the die and package housings are a major challenge.

Embodiments of the present disclosure describe novel superconducting qubit device packages, as well as related computing devices and methods. In one embodiment, an exemplary superconducting qubit device package includes a qubit die (i.e. a first substrate) and a package substrate (i.e. a second substrate). The qubit die houses a superconducting qubit device, (which device may also be referred to as a "quantum circuit" or a "quantum circuit assembly," that includes at least one superconducting qubit, but typically a plurality of superconducting qubits, and at least one resonator, but typically a plurality of resonators, the resonator(s) disposed at a first face of the qubit die. A surface of the package substrate includes a patterned layer of a superconductor provided thereon. The qubit die is attached to the package substrate so that one or more portions of at least one of the resonators face one or more portions of the superconductor face, i.e. the package may be referred to as a "flip-chip" package because the qubit die is "flipped" upside down so that the resonators are facing the package substrate. Such a package may have a number of advantages over conventional packaging methods. Using a flip-chip package architecture may eliminate, or at least reduce, the need for wirebond packaging described above, thus reducing design complexity and undesired coupling and enabling inclusion of larger numbers of qubits on the qubit die of the package. Providing the package substrate with a layer of a superconductor facing at least portions of the qubit device resonators advantageously reduces potential negative impact of the materials used in the package substrate on resonator performance and limiting some sources of qubit decoherence.

In order to provide substantially lossless connectivity to, from, and between the qubits, electrically conductive portions of various quantum circuit elements described herein (e.g. the resonators described herein) may be made from one or more superconductors. However, some or all of these electrically conductive portions could be made from electrically conductive materials which are not superconductive. In the following, unless specified otherwise, reference to an electrically conductive material or an electrically conductive circuit element of a quantum circuit implies that a superconductor may, but does not have to, be used. Furthermore, materials described herein as "superconductors" (which may be described, interchangeably as "superconductive/superconducting materials") may refer to materials, including alloys of materials, which exhibit superconducting behavior at typical qubit operating conditions, e.g. materials which exhibit superconducting behavior at very low temperatures at which qubits typically operate, but which do not necessarily exhibit such behavior at e.g. room temperatures. Some examples of materials which may be used as superconductors described herein include aluminum (Al), niobium (Ni), tin (Sn), titanium (Ti), osmium (Os), zinc (Zn), molybdenum (Mo), tantalum (Ta), vanadium (V), composites or alloys of such materials, e.g. niobium-titanium, niobium-aluminum, or niobium-tin, or nitrides of such materials, e.g. niobium nitride (NbN), titanium nitride (TiN), niobium titanium nitride (NbTiN), all of which are particular types of superconductors at qubit operating temperatures, as well as any combinations of any of these materials.

While some descriptions of various embodiments of the present disclosure are provided with reference to superconducting qubits, in particular to transmons, a particular class of superconducting qubits, at least some teachings of the present disclosure may be applicable to quantum circuits implementing other types of qubits, e.g. superconducting qubits other than transmons and/or qubits other than superconducting qubits, which may be packaged with a package substrate as described herein, all of such implementations being within the scope of the present disclosure. For example, the qubit device packages described herein may be used to package at least portions of hybrid semiconducting-superconducting quantum circuits.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Various aspects of the illustrative implementations may be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Furthermore, as used herein, terms indicating what may be considered an idealized behavior, such as e.g. "superconducting" or "lossless", are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-10 GHz, e.g. in 5-10 GHz, range, in order to be higher than thermal excitations, but low enough for ease of microwave engineering. However, advantageously, because excitation energy of qubits may be controlled by the circuit elements, qubits could be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Exemplary Quantum Circuits

In order to highlight the advantages offered by novel qubit device packages with package substrates having a patterned layer of a superconductor provided thereon, as described herein, it would be helpful to first describe various implementations of quantum circuits which could be included in a qubit die.

FIG. 1 provides a schematic illustration of an exemplary quantum circuit 100, according to some embodiments of the present disclosure. The exemplary quantum circuit 100 may represent any of the superconducting qubit devices implemented on a qubit die to be packaged with a package substrate as described herein.

As shown in FIG. 1, an exemplary quantum circuit 100 may include two or more qubits 102 (reference numerals following after a dash, such as e.g. qubit 102-1 and 102-2 indicate different instances of the same or analogous element). In case the quantum circuit 100 implements superconducting qubits (i.e. the qubits 102 are superconducting qubits), each of the superconducting qubits 102 may include one or more Josephson Junctions 104 electrically connected to one or more other circuit elements 106, which, in combination with the Josephson Junction(s) 104, form a non-linear oscillator circuit providing multi-level quantum system where the first two to three levels define the qubit under normal operation. For the example of a superconducting quantum circuit 100, the circuit elements 106 could be e.g. shunt capacitors, superconducting loops of a superconducting quantum interference device (SQUID), electrodes for setting an overall capacitance of a qubit, or/and ports for capacitively coupling the qubit to one or more of a readout resonator, a coupling resonator, and a direct microwave drive line or electromagnetically coupling the qubit to a flux bias line.

Typically, when a qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit, which, in turn, allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing direct-current (DC) or a pulse of current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Microwave drive lines (also known as "microwave lines" or "drive lines") are typically used to control the state of the qubits by providing a microwave pulse at the qubit frequency, which in turn stimulates (i.e. triggers) a transition between the 0 and 1 state of the qubit. By varying the length of this pulse, a partial transition can be stimulated, giving a superposition of the 0 and 1 states of the qubit.

As also shown in FIG. 1, an exemplary quantum circuit 100 typically includes a plurality of non-resonant transmission lines 108 and a plurality of resonators 110, e.g. coupling and readout resonators.

The non-resonant transmission lines 108 are typically used for communicating microwave signals to/from different quantum circuit elements and components, such as e.g. various control lines for various qubits. For example, for superconducting qubits, examples of the non-resonant transmission lines 108 include flux bias lines, microwave feed lines, and direct drive lines.

In general, a resonator 110 of a quantum circuit differs from a non-resonant microwave transmission line 108 in that a resonator is a transmission line that is deliberately designed to support resonant oscillations (i.e. resonance) within the line, under certain conditions. In contrast, non-resonant transmission lines may be similar to conventional microwave transmission lines in that they are designed to avoid resonances, especially resonances at frequencies/wavelengths close to the resonant frequencies/wavelengths of any resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible. For example, the ends of non-resonant transmission lines may be engineered to have a specific impedance (e.g. substantially 50 Ohm) to minimize impedance mismatches to other circuit elements to which the lines are connected, in order to minimize the amount of reflected signal at transitions (e.g., transitions from the chip to the package, the package to the connector, etc.).

A resonator may be made with fixed boundary conditions, and these boundary conditions may control the frequencies/wavelengths which will resonate within a given transmission line structure used to implement a resonator. In order to satisfy boundary conditions for resonance, each end of a transmission line that implements a resonator can be either a node, if it is shorted to ground (e.g. by being electrically connected to a ground plane of a transmission line structure that implements the resonator, or to any other ground potential), or an antinode, if it is capacitively or inductively coupled to another quantum circuit element. Thus, resonators 110 differ from non-resonant microwave transmission lines 108 in how these lines are terminated. A line used to route a signal on a substrate, i.e. one of the non-resonant transmission lines 108, typically extends from a specific source, e.g. a bonding pad or another type of electrical connection to a source, to a specific load (e.g. a short circuit proximate to a quantum dot device or another bonding pad or another electrical connection to a load). In other words, non-resonant transmission lines 108 terminate with direct electrical connections to sources, ground sinks, and/or loads. On the other hand, a transmission line resonator is typically composed of a piece of transmission line terminated with either two open circuits (in case of a half-wavelength resonator) or an open and a short circuit (in case of a quarter-wavelength resonator). In this case, for a desired resonant frequency, transmission line length may e.g. be a multiple of a microwave wavelength divided by 2 or 4, respectively. However, other terminations are possible, for example capacitive or inductive, and in this case the required line length to support resonance will be different from that identified above. For example, capacitive terminations may be used for resonators which are coupled to qubits, to a feedline, line, or to another resonator by a capacitive interaction.

Besides line termination by capacitive or inductive coupling or a short circuit, in order to support resonant oscillations, transmission line segments of the resonators 110 need to be of a specific length that can support such oscillations. That is why, often times, resonators 110 may be laid out on a substrate longer than the actual distance would require (i.e. a non-resonant transmission line would typically be laid out to cover the distance in the most compact manner possible, e.g. without any curves, wiggles, or excess length, while a resonator may need to have curves, wiggles, and be longer than the shortest distance between the two elements the resonator is supposed to couple in order to be sufficiently long to support resonance).

One type of the resonators 110 used with superconducting qubits are so-called coupling resonators (also known as "bus resonators"), which provide one manner for coupling different qubits together in order to realize quantum logic gates. Another type of the resonators 110 used with superconducting qubits are so-called "readout resonators," which may be used to read the state(s) of qubits. These two types of resonators are analogous in concept and have analogous underlying physics as readout resonators, except that a coupling or "bus" resonator involves only capacitive couplings between two or more qubits whereas a readout resonator involves capacitive coupling between two or more qubits and a feedline. A coupling resonator may be implemented as a microwave transmission line segment that includes capacitive or inductive connections to ground on both sides (e.g. a half-wavelength resonator), which results in oscillations (resonance) within the transmission line. While the ends of a coupling resonator have open circuits to the ground, each side of a coupling resonator is coupled, either capacitively or inductively, to a respective (i.e. different) qubit by being in the appropriate location and sufficient proximity to the qubit. Because different regions of a coupling resonator have coupling with a respective different qubit, the two qubits are coupled together through the coupling resonator. Thus, coupling resonators may be employed for implementing logic gates.

Turning to readout resonators, a readout resonator, similar to the bus/coupling resonator, is a transmission line segment. On one end it may have an open circuit connection to ground as well as any capacitively or inductively coupled connections to other quantum elements or a non-resonant microwave feedline. On the other end, a readout resonator may either have a capacitive connection to ground (for a half-wavelength resonator) or may have a short circuit to the ground (for a quarter-wavelength resonator), which also results in oscillations within the transmission line, with the resonant frequency of the oscillations being close to the frequency of the qubit. In some embodiments, a corresponding readout resonator may be provided for each qubit. A readout resonator is coupled to a qubit by being in the appropriate location and sufficient proximity to the qubit, again, either through capacitive or inductive coupling. Due to a coupling between a readout resonator and a qubit, changes in the state of the qubit result in changes of the resonant frequency of the readout resonator. In turn, changes in the resonant frequency of the readout resonator can be read externally via connections which lead to external electronics e.g. wire or solder bonding pads.

For the non-resonant transmission lines 108, some descriptions of flux bias lines were provided above and, in the interests of brevity are not repeated here. In general, running a current through a flux bias line, provided e.g. from a wirebonding pads or any other connection element, allows tuning (i.e. changing) the frequency of a corresponding qubit 102 to which a given flux bias line is connected. As a result of running the current in a given flux bias line, magnetic field is created around the line. If such a magnetic field is in sufficient proximity to a given qubit 102, e.g. by a portion of the flux bias line being provided next (sufficiently close) to the qubit 102, the magnetic field couples to the qubit, thereby changing the spacing between the energy levels of the qubit. This, in turn, changes the frequency of the qubit since the frequency is directly related to the spacing between the energy levels via the equation $E=h\nu$ (Planck's equation), where E is the energy (in this case the energy difference between energy levels of a qubit), h is the Planck's constant and $\nu$ is the frequency (in this case the frequency of the qubit). As this equation illustrates, if E changes, then $\nu$ changes. Different currents and pulses of currents can be sent down each of the flux lines allowing for independent tuning of the various qubits.

Typically, the qubit frequency may be controlled in order to bring the frequency either closer to or further away from another resonant item, for example a coupling resonator or a coupled neighbor qubit, to implement multi-qubit interactions, as may be desired in a particular setting.

For example, if it is desirable that a first qubit 102-1 and a second qubit 102-2 interact, via a coupling resonator (i.e. an example of the resonators 110) connecting these qubits, then both qubits 102 may need to be tuned to be at nearly the same frequency or a detuning equal, or nearly equal, to the anharmonicity. One way in which such two qubits could interact is that, if the frequency of the first qubit 102-1 is tuned very close to the resonant frequency of the coupling resonator, the first qubit can, when in the excited state, relax back down to the ground state by emitting a photon (similar to how an excited atom would relax) that would resonate within the coupling resonator. If the second qubit 102-2 is also at this energy (i.e. if the frequency of the second qubit is also tuned very close to the resonant frequency of the coupling resonator), then it can absorb the photon emitted from the first qubit, via the coupling resonator coupling these two qubits, and be excited from its ground state to an excited state. Thus, the two qubits interact, or are entangled, in that a state of one qubit is controlled by the state of another qubit. In other scenarios, two qubits could interact via exchange of virtual photons, where the qubits do not have to be tuned to be at the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator or on the neighboring qubit via a virtual photon transfer through the bus. If there is nowhere for such a frequency-detuned photon to go, the qubit will be better isolated from its surroundings and will live longer in its current state. Thus, in general, two or more qubits could be configured to reduce interactions with one another by tuning their frequencies to specific values or ranges.

The state(s) of each qubit 102 may be read by way of its corresponding readout resonator of the resonators 110. As explained below, the state of qubit 102 induces a shift in the resonant frequency in the associated readout resonator. This shift in resonant frequency can then be read out using its coupling to a feedline. To that end, an individual readout resonator may be provided for each qubit. As described above, a readout resonator may be a transmission line segment that includes a capacitive connection to ground on one side and is either shorted to the ground on the other side (for a quarter-wavelength resonator) or has a capacitive connection to ground (for a half-wavelength resonator), which results in oscillations within the transmission line (resonance) that depends upon the state of a proximal qubit. A readout resonator may be coupled to its corresponding qubit 102 by being in an appropriate location and sufficient proximity to the qubit, more specifically in an appropriate location and sufficient proximity to a first element (or "island") of the qubit 102 that capacitively couples to the readout resonator, when the qubit is implemented as a transmon. Due to a coupling between the readout resonator and the qubit, changes in the state of the qubit result in changes of the resonant frequency of the readout resonator. In turn, by ensuring that the readout resonator is in sufficient proximity to a corresponding microwave feedline, changes in the resonant frequency of the readout resonator induce changes in the transmission coefficients of the microwave feedline which may be detected externally.

A coupling resonator, or, more generally, a coupling component, allows coupling different qubits together, e.g. as described above, in order to realize quantum logic gates. A coupling component could be comprised of a coupling component on a neighboring qubit, a lumped element capacitor, a lumped element resonator, or a transmission line segment. A coupling transmission line segment (e.g., coupling resonator or bus resonator) is similar to a readout resonator in that it is a transmission line segment that includes capacitive connections to various objects (e.g., qubits, ground, etc.) on both sides (i.e. a half-wavelength resonator), which also results in oscillations within the coupling resonator. Each side/end of a coupling component is coupled (again, either capacitively or inductively) to a respective qubit by being in appropriate location and sufficient proximity to the qubit, namely in sufficient proximity to a first element (or "island") of the qubit that capacitively couples to the coupling component, when the qubit is implemented as a transmon. Because each side of a given coupling component has coupling with a respective different qubit, the two qubits are coupled together through the coupling component. Thus, coupling components may be employed in order to implement multi-qubit interactions.

In some implementations, a microwave line may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines may be used to only readout the state of the qubits as described above, while separate drive lines, may be used to control the state of the qubits. In such implementations, microwave lines used for readout may be referred to as readout lines, while microwave lines used for controlling the state of the qubits may be referred to as drive lines. Drive lines may control the state of their respective qubits 102 by providing to the qubits a microwave pulse at the qubit frequency, which in turn stimulates (i.e. triggers) a transition between the states of the qubit. By varying the length of this pulse, a partial transition can be stimulated, giving a superposition of the states of the qubit.

The circuit elements 106, the non-resonant transmission lines 108, and the resonators 110 may be considered, broadly, as "supporting circuitry" for the qubits 102 or/and the Josephson Junctions 104 (in case the qubits 102 are superconducting qubits). A further distinction could be made between "qubit supporting circuitry" in the form of the circuit elements 106 and "chip supporting circuitry" in the form of the non-resonant transmission lines 108 and the resonators 110. Further, any other connections for providing microwave or other electrical signals to different circuit elements and components of the quantum circuit 100, such as e.g. connections between electrodes of various circuit components, or connections between ground lines/planes of a particular transmission line for equalizing electrostatic potential on the ground lines/planes, may be considered as being within the general category of "supporting circuitry." Still further, the term "supporting circuitry" may also be used to refer to elements providing electrical interconnections to/from/between quantum circuit elements/components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog-to-digital converters, mixers, multiplexers, amplifiers, etc.

In the embodiments where the quantum circuit 100 implements qubits other than superconducting qubits, descriptions as provided above are still applicable except that the qubits 102 would not include Josephson Junctions 104 and the circuit elements 106 may differ from those described above.

The qubits 102, the non-resonant transmission lines 108, and the resonators 110 of the quantum circuit 100 may be provided on, over, or at least partially embedded in a substrate/die (not shown in FIG. 1). The substrate may be any substrate suitable for realizing quantum circuit assemblies described herein. In one implementation, the substrate may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure. Additional examples of substrates include silicon-on-insulator (SOI) substrates, III-V substrates, and quartz substrates.

In various embodiments, quantum circuits such as the one shown in FIG. 1 may be used to implement components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

A qubit die housing the quantum circuit 100 so that at least some of the resonators 110 are provided on a first face of the die may be packaged with a package substrate so that at least portions of the resonators 110 on the first face of the qubit die face one or more portions of a superconductor layer provided over the surface of the package substrate as described herein.

Figure 2:
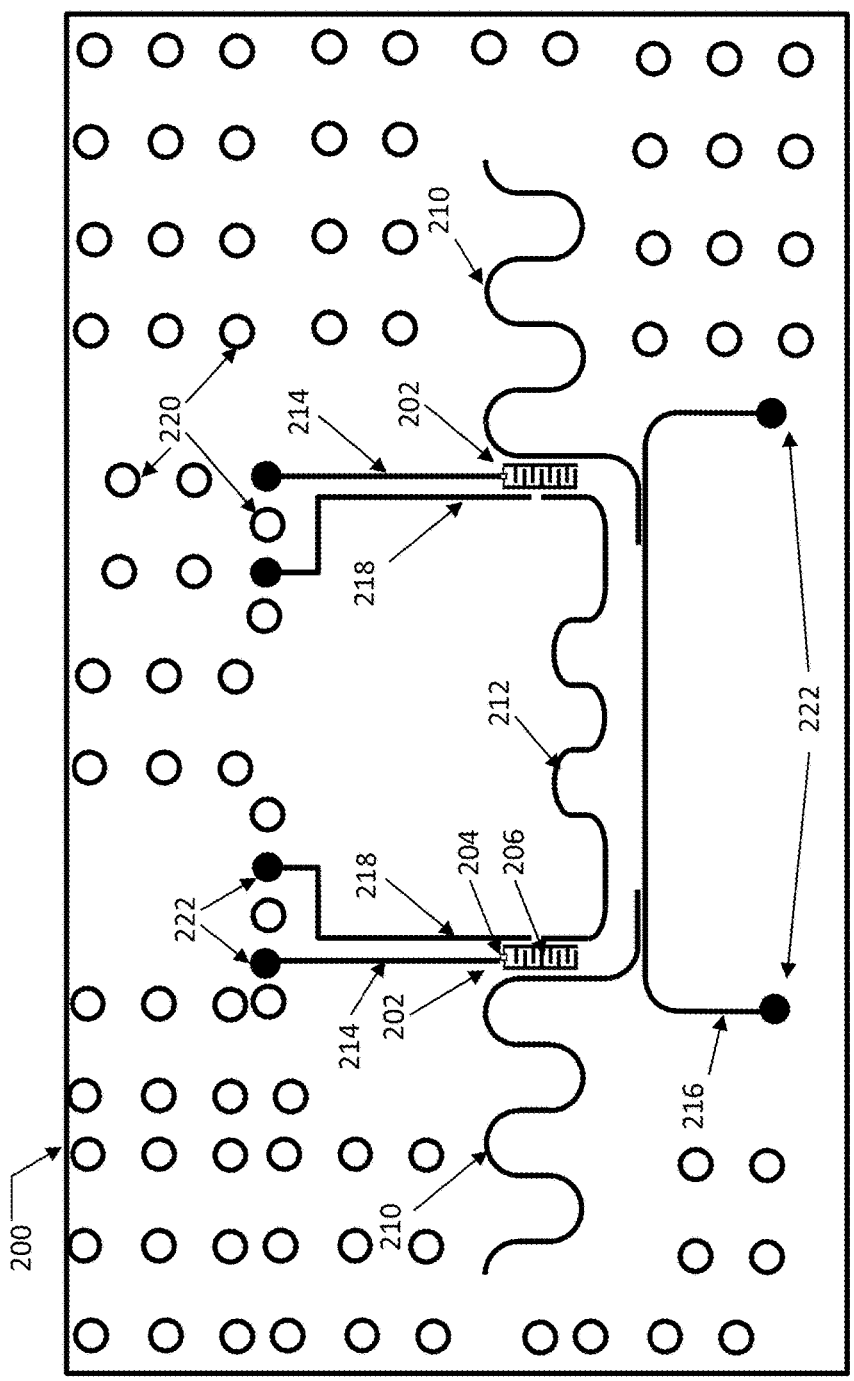
FIG. 2 provides a schematic illustration of an exemplary physical layout of a quantum circuit implementing superconducting qubits, according to some embodiments of the present disclosure.

FIG. 2 provides a schematic illustration of an exemplary physical layout of a quantum circuit 200 implementing superconducting qubits 202, according to some embodiments of the present disclosure.

Similar to FIG. 1, the exemplary quantum circuit 200 may represent any of the superconducting qubit devices implemented on a qubit die to be packaged with a package substrate as described herein. In particular, the quantum circuit 200 may be seen as illustrating an exemplary layout of the quantum circuit 100 shown in FIG. 1 where the qubits 102, shown in FIG. 2 as qubits 202, are implemented as transmons, a particular class of superconducting qubits characterized by the use of capacitors as "circuit elements 106." Transmons, which are a type of charge qubits with the name being an abbreviation of "transmission line shunted plasma oscillation qubits," are particularly promising for building quantum circuits and quantum computing devices because they exhibit reduced sensitivity to charge noise. The use of transmons is shown in FIG. 2 by illustrating that each of the two qubit 202 shown in FIG. 2 includes an interdigitated capacitor 206 (labeled for only one of the two qubits 202 shown in FIG. 2 in order to not clutter the drawing) and a SQUID loop 204 (a small square shown in FIG. 2, also labeled for only one of the two qubits 202 shown in FIG. 2). The capacitor 206 shown in FIG. 2 may be seen as an example of the circuit elements 106 shown in FIG. 1, while the Josephson Junctions of the SQUID loop 204 shown in FIG. 2 (Josephson Junctions not shown specifically in FIG. 2) may be seen as an example of the Josephson Junctions 104 shown in FIG. 1. In other embodiments, the capacitors 206 may be any other type of capacitors, not necessarily interdigitated capacitors as shown in FIG. 2.

Similar to FIG. 1, FIG. 2 illustrates two qubits 202. In addition, FIG. 2 illustrates exemplary layout of readout resonators 210 (one readout resonator 210 per qubit 202), a coupling resonator 212 coupling the two qubits 202, flux bias lines 214 (one flux bias line 214 per qubit 202), a microwave feedline 216 (illustrated as a single microwave feedline 216, although in other embodiments individual microwave feedlines may be used for each of the qubits 202), and drive lines 218. The readout and coupling resonators 210, 212 may be seen as examples of the resonators 110 shown in FIG. 1. The flux bias lines 214, microwave feedline 216, and drive lines 218 may be seen as examples of non-resonant transmission lines 108 shown in FIG. 1. Functionality of each of these elements is described above, with reference to FIG. 1, and, therefore, in the interests of brevity, is not repeated here.

In various embodiments, various conductive circuit elements shown in FIG. 2, e.g. resonators or various non-resonant transmission lines included in she quantum circuit 200 could have different shapes and layouts, and could be placed at different locations with respect to one another compared to what is shown in the example of FIG. 2. In general, the term "line" as e.g. used herein in context of resonant or non-resonant transmission lines, or e.g. signal lines of such transmission lines, does not imply straight lines, unless specifically stated so. For example, some resonators or non-resonant transmission lines or parts thereof (e.g. conductor strips of resonators or non-resonant transmission lines, which conductor strips may also be referred to as "signal lines") may comprise more curves, wiggles, and turns while other resonant or non-resonant transmission lines or parts thereof may comprise less curves, wiggles, and turns, and some resonators or non-resonant transmission lines, or parts thereof, may comprise substantially straight lines. In some embodiments, various resonators or non-resonant transmission lines may intersect one another, in such a manner that they don't make an electrical connection, which can be done by using e.g. a bridge, bridging one interconnect over the other. As long as these resonators and non-resonant transmission lines operate in accordance with use of these structures as known in the art for which some exemplary principles were described above, quantum circuits with different shapes and layouts of these quantum circuit elements than those illustrated in FIG. 2 are all within the scope of the present disclosure.

FIG. 2 further illustrates that the quantum circuit 200 includes various conductive contacts 220, 222 shown in FIG. 2 as white and black circles, respectively. The white circles (only 3 of which are labeled in FIG. 2 with the reference numeral 220 in order to not clutter the drawing) illustrate exemplary locations of ground conductive contacts 220 (i.e. contacts which are to be connected to the ground potential during operation of the device), e.g. conductive bumps, at a face of the qubit die, to be connected to the opposing face of a package substrate. As is known in the art, such ground contacts are typically used when a die supports propagation of microwave signals in order to e.g. suppress microwave parallel plate modes, cross-coupling between circuital blocks, and substrate resonant modes. In general, providing ground pathways may improve signal quality, enable fast pulse excitation, suppress radiation loss and undesired resonator modes, and improve the isolation between the different lines. The black circles (only 2 of which are labeled in FIG. 2 with the reference numeral 222 in order to not clutter the drawing) illustrate exemplary locations of signal conductive contacts 222 (i.e. contacts which are to be connected to the signal source during operation of the device), e.g. conductive bumps, at a face of the qubit die, to be connected to the opposing face of a package substrate. The signals conductive contacts 222 may be used for programming, tuning and readout of the qubits, e.g. as described above. The die on which these conductive contacts 220, 222 and the rest of the quantum circuit are provided may include multiple conductive layers that may be electrically isolated from each other by an insulating material, which could include any suitable material, such as an interlayer dielectric (ILD). Examples of insulating materials may include silicon oxide, silicon nitride, aluminum oxide, carbon-doped oxide, and/or silicon oxynitride.

The illustration of the location and the number of the ground contacts 220 and the signal contacts 222 in FIG. 2 is purely illustrative and, in various embodiments, the contacts 220, 222 may be provided at different places, as known in microwave engineering. Furthermore, while FIGS. 1 and 2 illustrate examples of quantum circuits comprising only two qubits, embodiments with any larger number of qubits are possible and are within the scope of the present disclosure.

Figure 3:
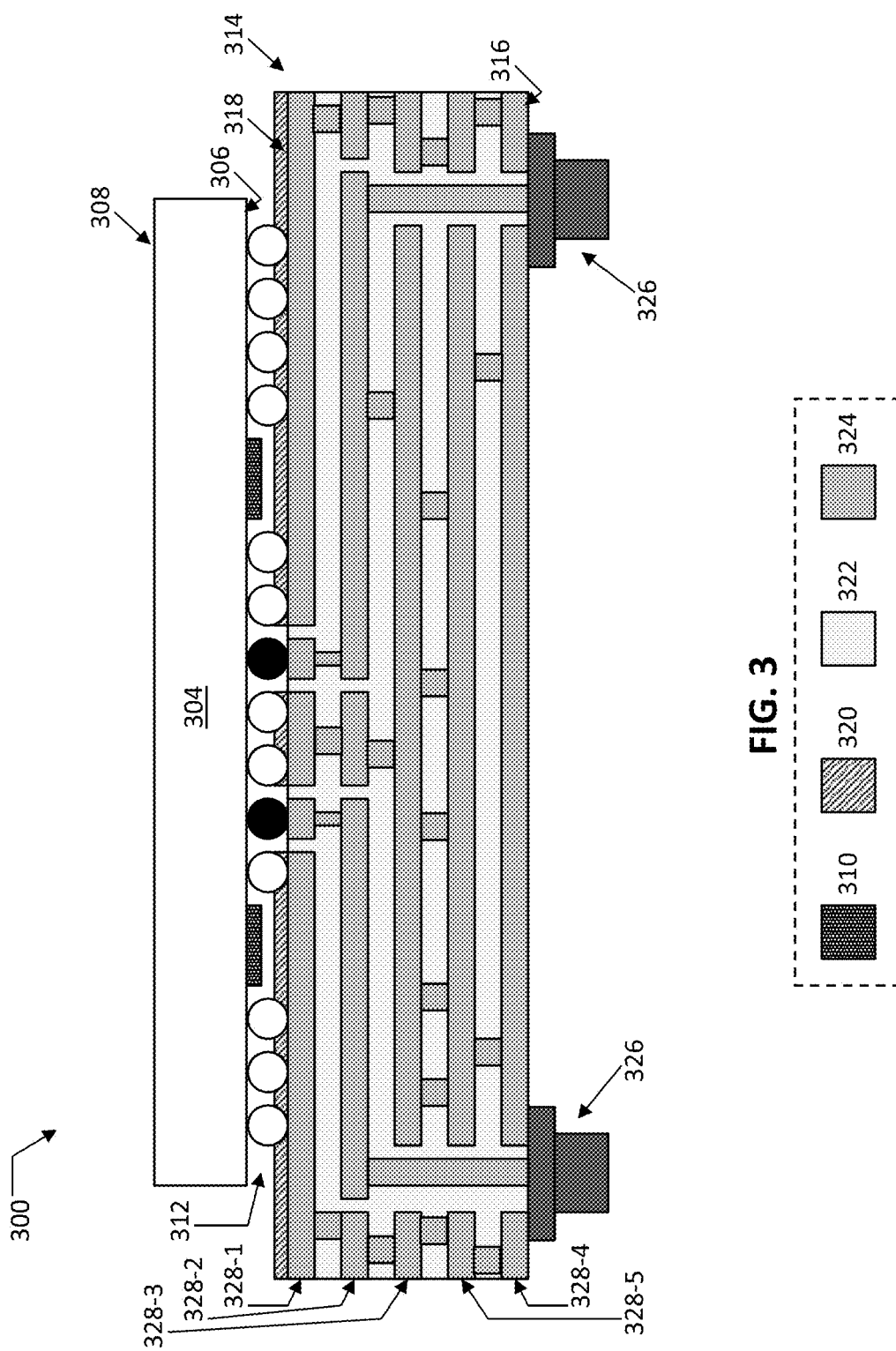
FIG. 3 provides a schematic illustration of an exemplary qubit device package coupling a die with one or more qubit devices to a package substrate, according to one embodiment of the present disclosure.
Figure 4:
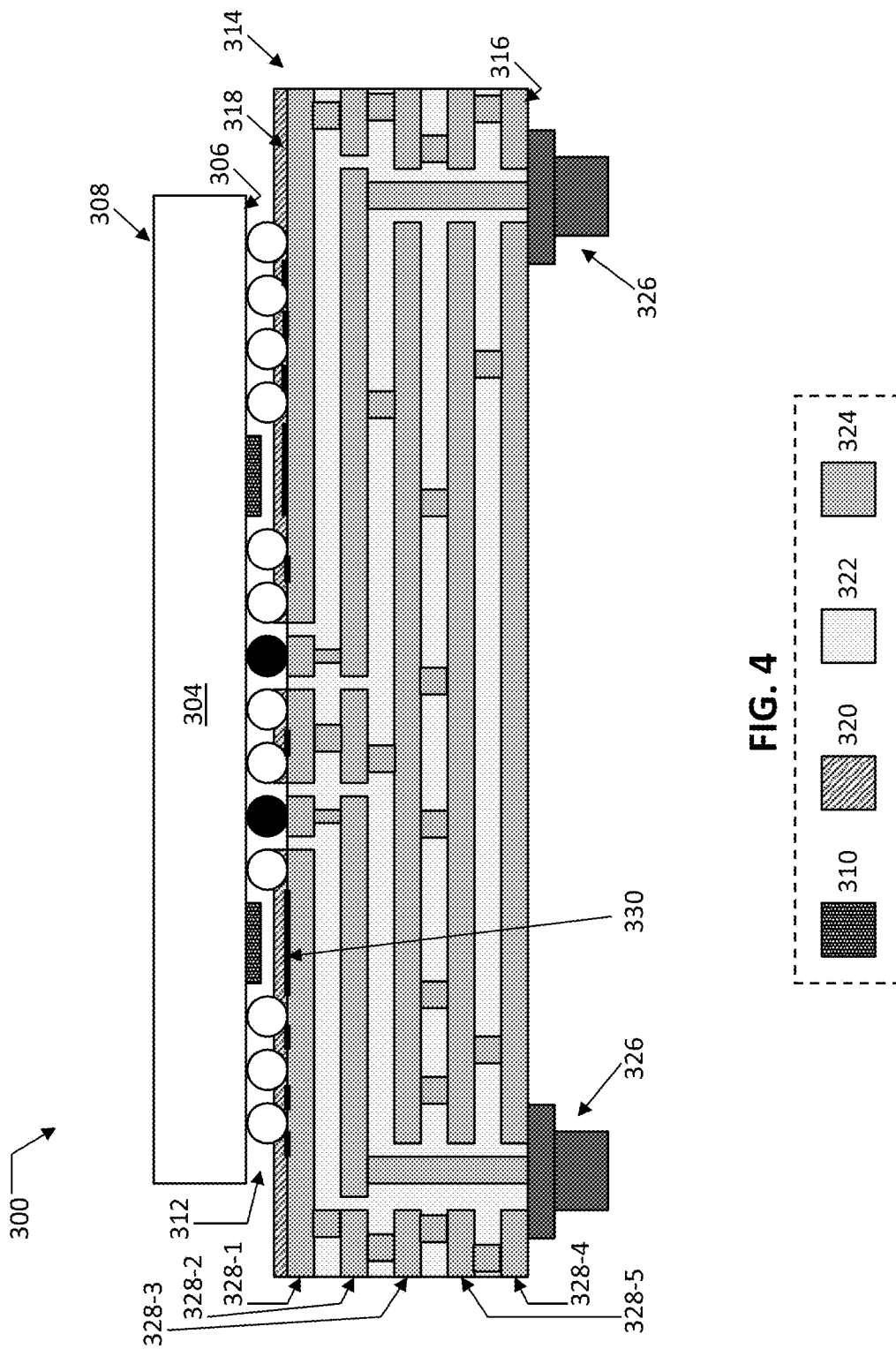
FIG. 4 provides a schematic illustration of an exemplary qubit device package coupling a die with one or more qubit devices to a package substrate, according to another embodiment of the present disclosure.

Flip-Chip Packaging of a Qubit Die with a Package Substrate having a Top Superconductor Layer In some embodiments, the quantum circuit 100, e.g. as illustrated with the physical layout shown in FIG. 2, may be included in/on a die and coupled to a package substrate to form a superconducting qubit device package. FIGS. 3 and 4 provide schematic illustrations of an exemplary qubit device package 300 coupling a qubit die 304 with one or more qubit devices to a package substrate 314, according to different embodiments of the present disclosure. A number of elements referred to in the description of FIGS. 3 and 4 with reference numerals are indicated in FIGS. 3 and 4 with different patterns, with a legend showing the correspondence between the reference numerals and patterns being provided at the bottom of FIGS. 3 and 4, and are not labeled in FIGS. 3 and 4 with arrows pointing to them in order to not clutter the drawings. For example, the legend illustrates that FIGS. 3 and 4 use different patterns to show the resonators 310, superconductor 320, etc.

FIGS. 3 and 4 illustrate that the qubit die 304 may have a first face 306 and a second face 308, and the package substrate 314 may have a first face 316 and a second face 318. The one or more qubit devices implemented in the qubit die 304 may include one or more quantum circuits 100, 200, any combination or any further variations of these circuits as described above. The specifics of these circuits are not shown in FIGS. 3 and 4 in order to not clutter the drawings, but two exemplary resonators are shown as resonators 310 which may be proximate to or provided on the first face 306 of the qubit die 304. The rest of the elements of the quantum circuit(s) implemented on the qubit die 304 may be implemented on or near the first face 306, on or near the second face 308, or anywhere in between. In general, any number of qubits 102/202, readout resonators 210, coupling resonators 212, flux bias lines 214, microwave lines 216, drive lines 218, conductive contacts 220, 222, and other components discussed herein with reference to the superconducting quantum circuits 100 and 200 may be included in the qubit die 304. Conductive pathways may extend and be coupled between various elements of the quantum circuit implemented on the qubit die 304, such conductive pathways not specifically shown in FIGS. 3 and 4 because the details of the quantum circuits are not specifically shown in these FIGS.

FIGS. 3 and 4 further illustrate first level interconnects 312 coupling the first face 306 of the qubit die 304 and to the second face 318 of the package substrate 314. Although not specifically shown in FIGS. 3 and 4 in order to not clutter the drawings, in some embodiments, conductive contacts may be provided on the first face 306 of the qubit die 304 and on the second face 318 of the package substrate 314 so that each first level interconnect 312 couples a conductive contact on the first face of the qubit die 304 with a corresponding conductive contact on the second face of the package substrate 314. Such conductive contacts on the first face of the qubit die 304 may include the conductive contacts 220 and 222 as shown in FIG. 2. Moreover, FIGS. 3 and 4 use notation of white and black circles similar to that used in FIG. 2, illustrating that some first level interconnects 312 may be used to provide connectivity to the ground potential (first level interconnects 312 shown in FIGS. 3 and 4 as white circles) while other first level interconnects 312 may be used to provide connectivity to the signal source/load (first level interconnects 312 shown in FIGS. 3 and 4 as black circles). Thus, if conductive contacts 220, 222 from FIG. 2 were shown in FIGS. 3 and 4, the first level interconnects 312 shown in FIGS. 3 and 4 as white circles would be electrically connected to the ground conductive contacts 220, while the first level interconnects 312 shown in FIGS. 3 and 4 as black circles would be electrically connected to the signal conductive contacts 222.

The conductive contacts at the first face 306 of the qubit die 304, and, therefore, the corresponding first level interconnects 312, may be connected to any suitable elements of the quantum circuit implemented on the qubit die 304, e.g. any of the quantum circuits 100, 200 described above. For example, in some embodiments, at least some of the conductive contacts at the first face 306 of the qubit die 304, and, therefore, the corresponding first level interconnects 312, may be electrically connected to one or more flux bias lines of the superconducting qubit device implemented by the quantum circuit of the qubit die 304. In such embodiments, the first level interconnects 312 and the package substrate 314 may be configured to enable provision of current, from a control logic external to the qubit die 304 to the one or more flux bias lines of the qubit die 304, e.g. for tuning a resonant frequency of one or more superconducting qubits of the superconducting qubit device, as described above. In another example, in some embodiments, at least some of the conductive contacts at the first face 306 of the qubit die 304, and, therefore, the corresponding first level interconnects 312, may be electrically connected to one or more drive lines of the superconducting qubit device implemented by the quantum circuit of the qubit die 304. In such embodiments, the first level interconnects 312 and the package substrate 314 may be configured to enable provision of current, from a control logic external to the qubit die to the one or more drive lines of the qubit die, for controlling a quantum state of one or more superconducting qubits of the superconducting qubit device, as described above. In yet another example, in some embodiments, at least some of the conductive contacts at the first face 306 of the qubit die 304, and, therefore, the corresponding first level interconnects 312, may be electrically connected to one or more readout lines coupled to the at least one resonator 310 implemented by the quantum circuit of the qubit die 304. In such embodiments, the first level interconnects 312 and the package substrate 314 may be configured to enable a control logic external to the qubit die to detect current in the one or more readout lines, for detecting a quantum state of one or more superconducting qubits of the superconducting qubit device, as described above.

In general, interconnect structures may be arranged within the superconducting quantum circuit implemented in the qubit die 304 and in the package substrate 314 to route electrical signals according to a wide variety of designs (in particular, the arrangement is not limited to the particular configuration of interconnect structures depicted in FIGS. 3-4 or any of the other accompanying figures, and may include more or fewer interconnect structures). During operation of the superconducting quantum circuit 100, 200 implemented in the qubit die 304, electrical signals (such as e.g. power, input/output (I/O) signals, including various control signals for external and internal control of the qubits 102, 202) may be routed to and/or from the qubits 102, 202 of the superconducting quantum circuit 100, 200 through the interconnects provided by the conductive contacts and conductive pathways of the qubit die 304 and the package substrate 314.

In various embodiments, the conductive contacts on the qubit die 304 and on the package substrate 314 may be formed of any suitable conductive material (e.g., a superconducting material). For example, in some embodiments, the conductive contacts on the qubit die 304 and/or on the package substrate 314 may include aluminum, and the first level interconnects 312 and/or the second level interconnects 326 may include an indium-based solder. In some embodiments, the conductive contacts on the qubit die 304 and/or on the package substrate 314 may include multiple layers of material that may be selected to serve different purposes. In some embodiments, such conductive contacts may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum. In some embodiments, the conductive contacts on the qubit die 304 and/or on the package substrate 314 may take form of solder bond pads, but other first level interconnect structures may be used (e.g., conductive epoxies, anisotropic conductive films, copper to copper bonding posts, etc.) to route electrical signals to/from the qubit die 304, as discussed below.

The package substrate 314 may include an insulating material 322 extending at various portions between the first face 316 and the second face 318. The insulating material 322 may be a dielectric material (e.g., an ILD, a silica filled resin, a build-up polymer, a glass cloth reinforced resin or a ceramic composite), and may take the form of any of the embodiments of the insulating materials disclosed herein, for example any suitable polymer, ceramic, polymer composite, oxide or nitride materials. Conductive pathways 324 may extend through the insulating material 322 of the package substrate 314 between the first face 316 and the second face 318 of the package substrate 314, electrically coupling various ones of the conductive contacts at the second face 318 to various ones of the conductive contacts at the first face 316, in any desired manner. The conductive pathways 324 may include one or more conductive vias, one or more conductive lines, or a combination of conductive vias and conductive lines, for example. The illustration of the location, the type, and the number of the conductive pathways 324 in the package substrate 314 in FIGS. 3 and 4 is purely illustrative and, in various embodiments, the conductive pathways 324 may be implemented differently, as known for package substrates. In some embodiments, conductive lines of the qubit die 304 and the package substrate 314 may extend into and out of the plane of the drawing, providing conductive pathways to route electrical signals to and/or from various elements in the qubit die 304.

The conductive vias and/or lines that provide the conductive pathways in/on the qubit die 304 or/and in/on the package substrate 314 (e.g. conductive pathways 324) may be formed using any suitable techniques. Examples of such techniques may include subtractive fabrication techniques, additive or semi-additive fabrication techniques, single Damascene fabrication techniques, dual Damascene fabrication techniques, or any other suitable technique. In some embodiments, layers of insulator material, such as e.g. oxide material or nitride material, e.g. the insulating material 322, may insulate various structures in the conductive pathways from proximate structures, and/or may serve as etch stops during fabrication. In some embodiments, additional layers, such as e.g. diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

In some embodiments, the conductive pathways 324 may be arranged in "layers" as shown in FIGS. 3 and 4 illustrating metal layers 328-1, 328-2, 328-3, 328-4, and 328-5 implementing interconnect lines and trenches, with the first metal layer 328-1 being the one closest to the qubit die 304 and being connected to the ground potential. The metal layers 328 in different planes are separated by the insulating material 322, thus together, the metal layers 328 and the layers of the insulating material 322 in between are referred to as a "stack-up" of the package substrate 314, except for where the different metal layers need to be in electrical contact in order to implement the necessary routing. For example, FIGS. 3 and 4 illustrate that portions of each pair of adjacent metal layers are separated by the insulating material 322, e.g. the first metal layer 328-1 is separated from the second metal layer 328-2 by the insulating material 322, the second metal layer 328-2 is separated from the third metal layer 328-3, and so on. The metal layers 328 in different planes are separated by the insulating material except for where an electrical contact needs to be made between them, which contact may be implemented using vias connecting the metal layers of different planes, as e.g. shown with two vias extending from the signal first level interconnects 312 (i.e. black circuits) connected to the first metal layer 328-1 to the second metal layer 328-2. Any of the metal layers may also be directly connected to the conductive contacts at the first face 316 or the second face 318 of the package substrate 314, as e.g. shown with the second metal layer 328-2 being connected, e.g. using a via structure, to the second level interconnects 326. In other embodiments, any other number of the metal layer 328 may be used than what is shown in FIGS. 3 and 4, and the layers 328 may be arranged in any other configuration, as needed to implement any particular routing scheme.

In some embodiments, the package substrate 314 may be or may otherwise include a silicon interposer, and at least portions of some of the conductive pathways 324 may be through-silicon vias. Silicon may have a desirably low coefficient of thermal expansion compared with other dielectric materials that may be used for the insulating material 322, and thus may limit the degree to which the package substrate 314 expands and contracts during temperature changes relative to such other materials (e.g., polymers having higher coefficients of thermal expansion). A silicon interposer may also help the package substrate 314 achieve a desirably small line width and maintain high connection density to the qubit die 304.

Limiting differential expansion and contraction may help preserve the mechanical and electrical integrity of the superconducting qubit device package 300 as the superconducting qubit device package 300 is fabricated (and exposed to higher temperatures) and used in a cooled environment (and exposed to lower, e.g. cryogenic, temperatures). In some embodiments, thermal expansion and contraction in the package substrate 314 may be managed by maintaining an approximately uniform density of the conductive material in the package substrate 314 (so that different portions of the package substrate 314 expand and contract uniformly), using reinforced dielectric materials as the insulating material 322 (e.g., dielectric materials with silicon dioxide fillers), or utilizing stiffer materials as the insulating material 322 (e.g., a prepreg material including glass cloth fibers).

In some embodiments, the insulating material 322 of the package substrate 314 is selected to be the same as the insulating material of the superconducting qubit die 304. In one implementation, the qubit die 304 and the package substrate 314 may be a crystalline substrate such as, but not limited to a silicon or a sapphire substrate, and may be provided as a wafer or a portion thereof. In other implementations, the substrate may be non-crystalline. In general, any material that provides sufficient advantages (e.g. sufficiently good electrical isolation and/or ability to apply known fabrication and processing techniques) to outweigh the possible disadvantages (e.g. negative effects of various defects), and that may serve as a foundation upon which a quantum circuit may be built, falls within the spirit and scope of the present disclosure. Additional examples of substrates include silicon-on-insulator (SOI) substrates, III-V substrates, and quartz substrates.

Selecting the substrate for the superconducting qubit die 304 and the package substrate 314 to be of the same material may help ensuring that thermal coefficients of expansion/contraction are the same or substantially the same for these two substrates, which, in turn allows very small pitch interconnects, higher mechanical reliability due to less stress on the interconnects, and simpler design for manufacturing (since differences in thermal expansion during high temperature assembly are reduced). In addition, reduced stresses on the superconducting films in the die can help improve the electrical performance and lifetime of the device.

Turning back to the first level interconnects 312 shown in FIGS. 3 and 4 with white circles to indicate ground connections and black circles to indicate signal connections, the circular shape chosen to show the first level interconnects 312 represents that, in some embodiments, the first level interconnects 312 may include solder bumps or balls, for example, the first level interconnects 312 may be flip chip (or controlled collapse chip connection, C4) bumps disposed initially on the qubit die 304 or on the package substrate 314. In various embodiments, the solder of the first level interconnects 312 may include indium, copper, gold, bismuth, silver, or gallium.

In some embodiments, the structures and materials in the quantum circuit/device implemented in the qubit die 304 may be damaged if the quantum circuit is exposed to the high temperatures that are common in conventional integrated circuit processing (e.g., greater than 100 degrees Celsius, or greater than 200 degrees Celsius). Therefore, in some embodiments in which the first level interconnects 312 include solder, the solder may be a low-temperature solder (e.g., a solder having a melting point below 180 degrees Celsius, preferably even below 100 degrees Celsius) so that it can be melted to couple the conductive contacts on the first face of the qubit die 304 and the conductive contacts at the second face of the package substrate 314 without having to expose the qubit die 304 to higher temperatures and risk damaging the quantum circuit implemented thereon. Examples of solders that may be suitable include indium-based solders (e.g., solders including indium alloys). When low-temperature solders are used, however, these solders may not be fully solid during handling of the quantum device package 300 (e.g., at room temperature or temperatures between room temperature and 100 degrees Celsius), and thus the solder of the first level interconnects 312 alone may not reliably mechanically couple the qubit die 304 and the package substrate 314 (and thus may not reliably electrically couple the qubit die 304 and the package substrate 314). In some such embodiments, the quantum device package 300 may further include a mechanical stabilizer (not specifically shown in FIGS. 3 and 4), such as e.g. a suitable underfill material, for example, an epoxy-based material, to maintain mechanical coupling between the qubit die 304 and the package substrate 314 even when solder of the first level interconnects 312 is not solid.

Second level interconnects 326 (e.g., radiofrequency (RF) connectors, solder balls, or other types of interconnects) may couple the conductive contacts (not specifically shown in FIGS. 3 and 4) on the first face 316 of the package substrate 314 to another component, such as a circuit board (not specifically shown in FIGS. 3 and 4). Examples of arrangements of electronics packages that may include an embodiment of the superconducting qubit device package 300 are discussed below with reference to FIG. 8. The qubit die 304 may be brought in contact with the package substrate 314 using a pick-and-place apparatus, for example, and a reflow or thermal compression bonding operation may be used to couple the qubit die 304 to the package substrate 314 via the first level interconnects 312.

Having first level interconnects 312 disposed between the first face 306 of the qubit die 304 and the second face 318 of the package substrate 314 (e.g., using solder bumps as part of flip-chip packaging techniques) may enable the superconducting qubit device package 300 to achieve a smaller footprint and higher die-to-package-substrate connection density than could be achieved using conventional wirebond techniques in which conductive contacts between the qubit die 304 and the package substrate 314 would be constrained to be located on the periphery of the qubit die 304. Additionally, in some applications, wirebond interconnects may generate unacceptable amounts of heat or RF radiation that may damage or otherwise interfere with the performance of the superconducting quantum circuit implemented on the qubit die 304. Using solder bumps as the first level interconnects 312 may enable the superconducting qubit device package 300 to have much lower parasitic inductance relative to using wirebonds to couple the qubit die 304 and the package substrate 314, which may result in an improvement in signal integrity for high speed signals communicated between the qubit die 304 and the package substrate 314.

A further advantage that may be achieved by the superconducting qubit device package 300 as e.g. shown in FIG. 3 or 4 is enabled by providing a patterned layer of a superconductor 320 over the first face 318 of the package substrate 314 in areas so that at least portions of one or more of the resonators 310 face at least portions of the superconductor 320 (preferably all of the resonators 310 face the superconductor 320. Such a layer of the superconductor 320 in front of the resonators 310 may act as an electromagnetic shield so that the electromagnetic fields extending from the resonators 310 would encounter the superconductor 320 which would reduce the effects of potentially lossy materials of the package substrate 314 (e.g. of the insulating material 322 and/or of the non-superconducting conductive material of the conductive pathways 324) on the performance of the resonators 310. Any suitable superconductor material may be used to implement the superconductor 320, e.g. aluminum or niobium.

FIGS. 3 and 4 illustrate different embodiments in that, in FIG. 3, the superconductor 320 is provided directly over the first metal layer 328-1 of the package substrate 314 and being in electrical contact with the first metal layer 328-1. On the other hand, FIG. 4 illustrates an embodiment where the surface of the package substrate 314 may be coated with a material which is not wetted by the solder material when the first level interconnects 312 are implemented as solder bumps or balls. This material is generally known as a solder mask and can take any appropriate form, such as silicon nitride, aluminum oxide, and silicon oxide. In some embodiments, the solder mask may be a polyimide or similar material, or any other appropriate type of packaging solder resist material. In some embodiments, the solder resist material may be a liquid or dry film material including photoimageable polymers or photoimageable silica filled polymers. In some embodiments, the solder resist material may be non-photoimageable. The presence of this solder mask material enables solder mask defined contacts. The solder mask is shown in FIG. 4 as a black line with a reference numeral 330. As shown in FIG. 4, the solder mask 330 may be provided over some portions of the first metal layer 328-1, and the superconductor 320 is provided over some or all portions of the solder mask 330. Thus, in the embodiment of FIG. 4, the solder mask 330 is provided between portions of the first metal layer 328-1 and portions of the superconductor 320. In such an embodiment, other portions of the superconductor 320 are still in contact with other portions of the first metal layer 328-1, thus ensuring electrical connectivity of the superconductor 320 to the ground potential, since the first metal layer 328-1 is connected to the ground potential. In the embodiment of FIG. 3, at least portions, or all of, the superconductor 320 is in contact with the first metal layer 328-1, also ensuring electrical connectivity of the superconductor 320 to the ground potential. Covering at least portions of the top surface of the package substrate 314 with the superconductor 320 connected to the ground potential provides a ground plane that is substantially continuous in that there are no voids in the ground plane of the package substrate 314 under the resonators 310, which may improve the grounding performance of the package and may help suppress some of the undesired coupled slotline modes.

Since the first metal layer 328-1 and the superconductor 320 are connected to the ground potential, the first layer from the upper surface 318 of the package substrate 314 in which the signals from the signal first level interconnects 312 may be routed is the second metal layer 328-2. Thus, at least one first level interconnect 312 coupling a signal conductor of a transmission line of the superconducting qubit device implemented in the qubit die 304, e.g. a signal conductor of one of the resonators 310, or a signal conductor of one of the non-resonant transmission lines of a quantum circuit implemented in the qubit die 304, e.g. flux bias line, microwave feedline, etc., to an associated conductive contact at the second face 318 of the package substrate 314 may be coupled to a metal layer that is in a plane closest to a plane of a metal layer closest to the qubit die (i.e. is coupled to the metal layer 328-2 that is second from the surface of the metallization stack closest to the qubit die 304). Thus, providing the superconductor 320 advantageously allows routing the signal conductors of transmission lines of the superconducting qubit device as close to the surface of the package substrate 314 as the second metal layer 328-2 of the package substrate.

A thickness of the superconductor 320 may be selected based on the following considerations. In general, it is preferable to have the superconductor 320 thick enough to avoid the proximity effect between the non-superconductive metal of the first metal layer 328-1, e.g. copper, and the superconductive metal of the superconductor 320. Additionally, increasing the thickness of the superconductor 320 may help avoid cracks in the superconducting layer during cooling and heating cycles of the manufacturing processes and during operation. The proximity effect may be explained as follows. At the interface between the two materials, there is a transition region where normal and superconducting electrons exist. If the superconductor 320 is too thin, then the behavior will be dominated by the normal metal of the first metal layer 328-1. Thus the superconductor 320 may be formed to be thick enough to allow for a superconducting layer to exist on the surface of the package substrate 314 facing the qubit die 304. This requirement maybe alleviated somewhat if the solder mask material 330 is present between the superconductor 320 and the normal package metal of the first metal layer 328-1. For example, in the embodiments of FIG. 3 (i.e. without the solder mask 330), the superconductor 320 may have a thickness between about 10 and 2000 nanometers, including all values and ranges therein, e.g. between about 200 and 800 nanometers, or between about 200 and 400 nanometers. On the other hand, in the embodiments of FIG. 4 (i.e. with the solder mask 330), the superconductor 320 may have a thickness between about 10 and 1000 nanometers, including all values and ranges therein, e.g. between about 50 and 500 nanometers, or between about 100 and 300 nanometers.

When the superconductor 320 is used without a solder mask, i.e. the embodiment of FIG. 3, then it would be advantageous if the superconductor 320 could also act as a solder mask, i.e. if the superconductor 320 would have a sufficiently large contact angle with molten solder that may be used in the first level interconnects 312 (i.e. if the superconductor 320 is not wetted by solder). In general, this is the case for compound superconductors such as TiN, NbN, NbTiN, and for superconductors which form thin surface oxides, such as Al or Ti. Such superconductors can effectively act as a solder mask in the embodiments where a separate solder mask between the superconductor and the non-superconductive layers of the first metal layer of the metallization stack is absent.

Providing the superconductor 320 over at least portions of the second face 318 of the package substrate 314 as described herein may provide one or more of the following advantages. Having the superconductor 320 in front of the resonators 310 allows placing the resonators 310 very close to the package surface with minimal impact on their loss performance. As a result, the requirement of the first level interconnects 312 being tall enough to increase the distance between the resonators 310 and the package substrate 314 may be relaxed, i.e. the first level interconnects 312 may be made smaller, which would enable higher density of such interconnects per unit area of the qubit die 304. Another advantage is the simplified design in that the package 300 can be designed for improved RF performance without requiring areas without routing (i.e. without metal lines) and solder masks around the resonators 310 and qubits. For example, providing the superconductor 320 allows leaving the metal lines of the first metal layer 328-1 in the areas of the package substrate 314 facing (i.e. opposite) the resonators 310. In addition, providing a layer of a superconductor over a package substrate enables any type of package substrates to be used, i.e. it relaxes requirements on the packages. For example, organic packages with thick metal layers may be used to minimize the losses. Alternatively, ceramic packages with lower coefficient of thermal expansion (CTE) may also be used to improve the thermomechanical reliability of the package.

In some implementations, the package substrate 314 may be used to couple the qubit die 304 to a further die (not specifically shown in FIGS. 3 and 4). In some embodiments, such a further die may also be a qubit die similar to the qubit die 304, i.e. a die implementing one or more quantum circuits/devices as described herein. In other embodiments, such a further die may include one or more non-quantum circuits, e.g. the die may include control logic for controlling the operation of the superconducting quantum circuit provided on the qubit die 304, thus providing control logic integrated with the superconducting qubit die 304 on the same chip or the same package substrate 314. In some embodiments, the control logic may provide peripheral logic to support the operation of the superconducting quantum circuit provided on the qubit die 304. For example, the control logic may control the performance of a read operation, control the performance of a write operation, control the clearing of quantum bits, etc. The control logic may also perform conventional computing functions to supplement the computing functions which may be provided by the superconducting quantum circuit provided on the qubit die 304. For example, the control logic may interface with one or more of the other components of a quantum computing device, such as e.g. a quantum computing device 2000 described below, in a conventional manner, and may serve as an interface between the superconducting quantum circuit provided on the qubit die 304 and conventional components. In some embodiments, the control logic may be implemented in or may be used to implement a non-quantum processing device 2028 described below with reference to FIG. 9. In various embodiments, mechanisms by which the control logic controls operation of the superconducting quantum circuit provided on the qubit die 304 may be take the form of an entirely hardware embodiment, an entirely software embodiment (including firmware, resident software, micro-code, etc.) or an embodiment combining software and hardware aspects. For example, the control logic may implement an algorithm executed by one or more processing units, e.g. one or more microprocessors, of one or more computers. The control that the control logic would exercise over the operation of the superconducting quantum circuit provided on the qubit die 304 would depend on the type of qubits that the quantum circuit component uses. For example, if the quantum circuit component uses superconducting qubits, the control logic could be configured to provide appropriate currents in any of flux bias lines, microwave lines, and/or drive lines in order to initialize and manipulate the superconducting dots, e.g. as described herein. In some embodiments of superconducting qubits, the control logic may be configured to detect current(s) in microwave line(s) and to control the operation of the superconducting quantum circuit provided on the qubit die 304 based on the detected current(s). By detecting current in a microwave line, the control logic may be able to assess/detect the state of the corresponding qubit(s) to which the line is coupled. In some further embodiments, the control logic may further be configured to also control the current(s) in microwave line(s). By controlling the current in a microwave line, control logic may be configured to control (e.g. change) the state of the corresponding qubit(s) to which the line is coupled. In such further embodiments, the control logic may be configured to switch operation of the microwave lines between controlling the current in the microwave lines to control states of the qubit(s) and detecting the current in the microwave lines to detect the states of the qubit(s). Thus, the control logic can operate the microwave lines in a half-duplex mode where the microwave lines are either used for readout or for setting the state(s) of the corresponding qubits. In some embodiments of superconducting qubits, the control logic may be configured to control current(s) in one or more drive lines. By controlling the current in a drive line, control logic is configured to control (e.g. change) the state of the corresponding qubit(s) to which the line is coupled. When drive lines are used, the control logic can use the microwave lines for readout of the state(s) of the corresponding qubits and use the drive lines for setting the state(s) of the qubits, which would be an alternative to the half-duplex mode implementation described above. For example, the control logic may be configured to control the current in the one or more drive lines by ensuring provision of one or more pulses of the current at a frequency of the one or more qubits. In this manner, the control logic can provide a microwave pulse at the qubit frequency, which in turn stimulates (i.e. triggers) a transition between the states of the corresponding qubit. In some embodiments, the control logic may be configured to control a duration of these pulses. By varying the length/duration of the pulse(s), the control logic can stimulate a partial transition between the states of the corresponding qubit, giving a superposition of the states of the qubit. In some embodiments, the control logic may be configured to determine the values of the control signals applied to the elements of the superconducting quantum circuit provided on the qubit die 304.

In some embodiments, the further die to which the qubit die 304 may be coupled via the package substrate 314 may further include circuits performing additional or different functionality than the control logic described above. For example, such a further die may include components of a wireless communication device, such as e.g. amplifiers, radio frequency (RF) receivers, RF transmitters, etc., in order to enable wireless communication between the superconducting qubit die 304 and various external devices.

Figure 5:
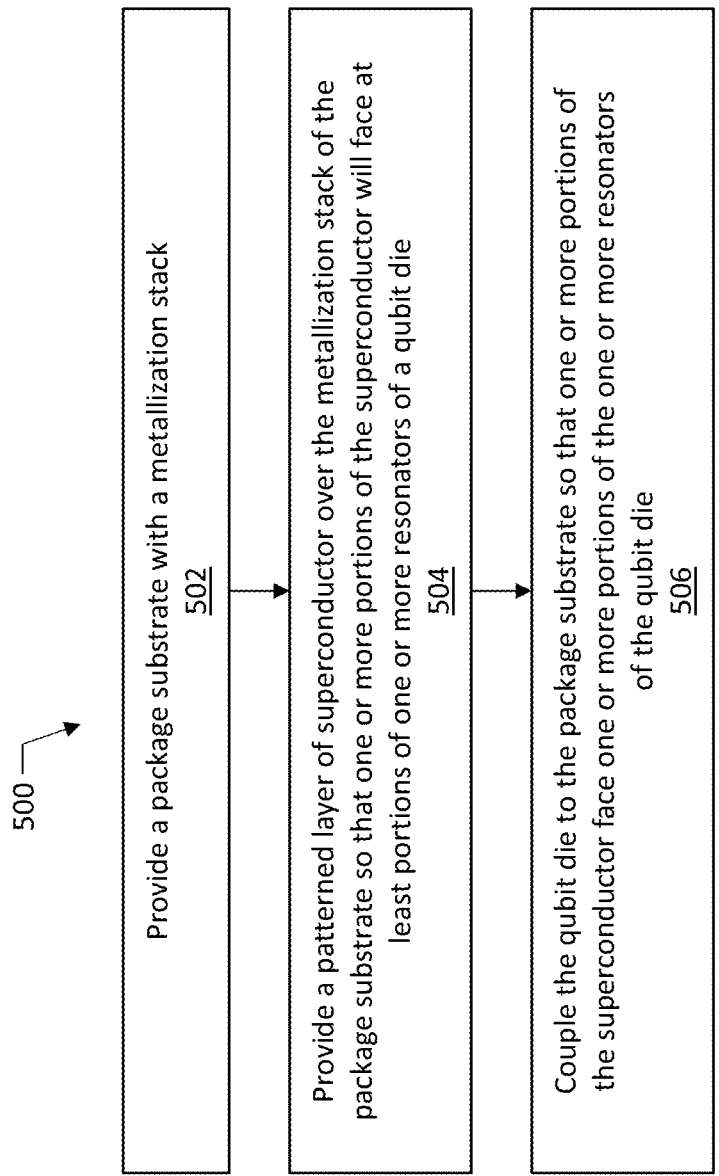
FIG. 5 is a flow diagram of an exemplary method of fabricating a qubit device package, according to various embodiments of the present disclosure.

Qubit device packages with a superconductor layer over the face of a package substrate that faces a qubit die as disclosed herein may be manufactured using any suitable techniques. For example, FIG. 5 is a flow diagram of an example method 500 of manufacturing such packages in accordance with some embodiments of the present disclosure. Although the operations of the method 500 are illustrated once each and in a particular order, the operations may be performed in any suitable order and repeated as desired. For example, one or more operations may be performed in parallel to manufacture multiple qubit device packages substantially simultaneously. In another example, the operations may be performed in a different order to reflect the structure of a qubit device package in which a package substrate with a top superconductor layer as described herein will be included. In addition, the manufacturing method 500 may include other operations, not specifically shown in FIG. 5, such as e.g. various cleaning operations as known in the art. For example, in some embodiments, the structure/assembly may be cleaned prior to, during, or/and after any of the processes of the method 500 described herein, e.g. to remove surface-bound organic and metallic contaminants, as well as subsurface contamination. In some embodiments, cleaning may be carried out using e.g. chemical solutions (such as organic solvents or specialized cleaners), while the metal oxides may be removed using acid solutions (e.g., a hydrochloric acid). In another example, the method 500 may further include other manufacturing operations related to fabrication of other components of a qubit device package, also not specifically shown in FIG. 5. FIGS. 6A-6E illustrate various exemplary stages in the manufacture of a qubit device package assembly using the method shown in FIG. 5 shown for the exemplary embodiment of the present disclosure illustrated in FIG. 3.

At 502, a package substrate with a suitable metallization stack may be provided. The package substrate provided at 502 may take the form of any of the embodiments of the package substrates 314 disclosed herein, for example (e.g., any of the embodiments discussed herein with reference to the packages 300). FIG. 6A illustrates an assembly 602 showing a result of implementing the process 502.

Figure 6D:
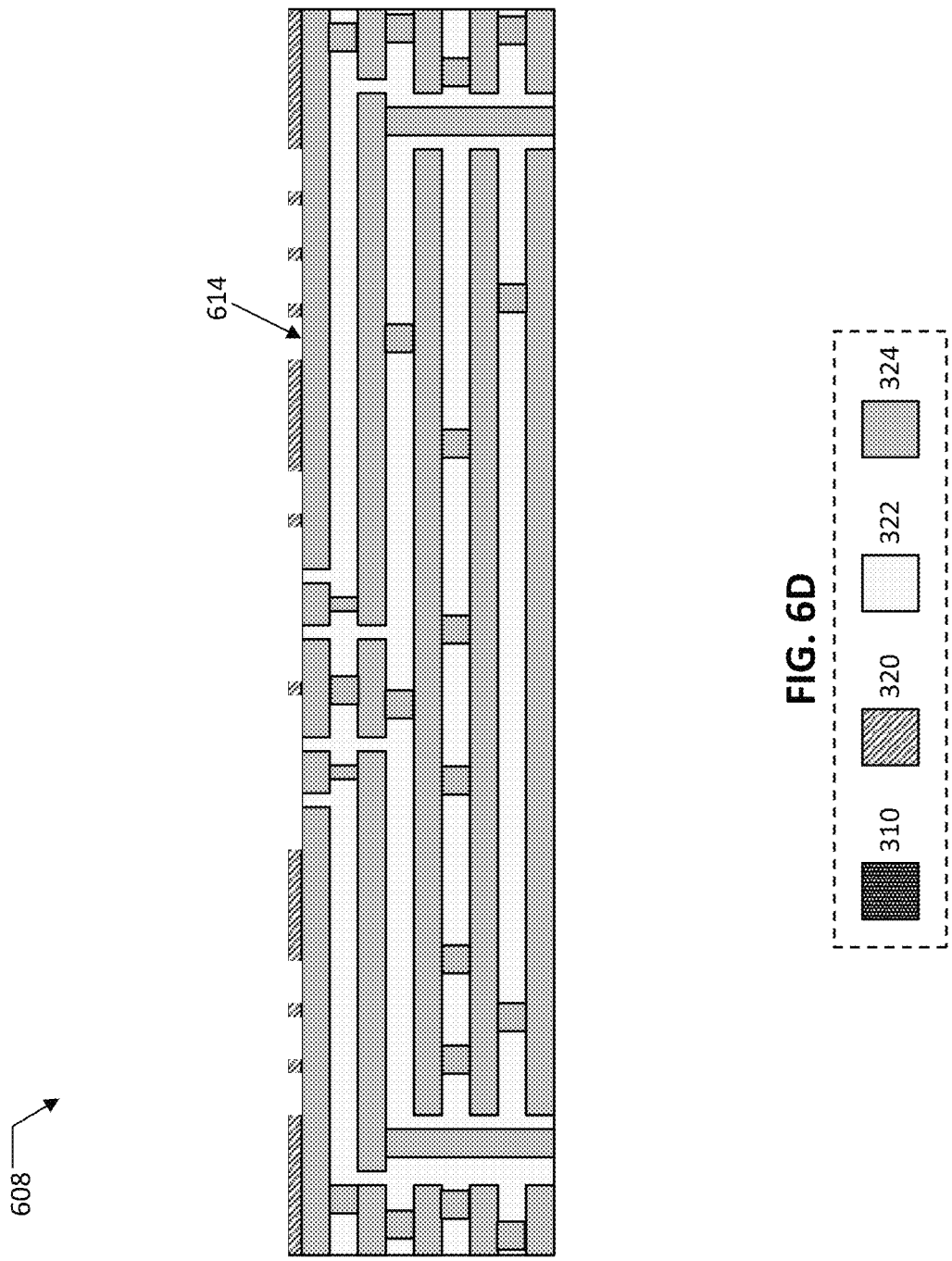

At 504, a patterned layer of superconductor is provided over the metallization stack of the package substrate so that one or more portions of the superconductor will face at least portions of one or more resonators of a qubit die. The patterned layer of superconductor provided at 504 may take the form of any of the embodiments of the superconductor 320 disclosed herein, for example (e.g., any of the embodiments discussed herein with reference to the packages 300). In various embodiments, the patterned superconductor may be provided at 504 using any suitable processes, some of which are illustrates in FIGS. 6B-6D. FIG. 6B illustrates an assembly 604 showing a result of implementing the process 504 by depositing, over the package substrate 314, and patterning photoresist, or any other similar sacrificial material, to form photoresist structures 614 (only one of which is labeled in FIG. 6B in order to not clutter the drawing) which define areas where the superconductor 320 is not to be present in the final package. Any suitable deposition and patterning techniques as known in the art may be used to realize the assembly 604. FIG. 6C illustrates an assembly 606 showing a result of implementing the process 504 by depositing, over the photoresist structures 614, a layer of superconductor material which will later serve as the superconductor 320 described herein. Any suitable deposition techniques as known in the art may be used to realize the assembly 606, e.g. physical vapor deposition (PVD), such as sputtering, atomic layer deposition (ALD), or chemical vapor deposition (CVD). FIG. 6D illustrates an assembly 608 showing a result of implementing the process 504 by removing the photoresist structures 614 with a layer of superconductor material deposited thereon, e.g. using a suitable lift-off process as known in the art, to yield a patterned superconductor 320 with openings 616 (only of which is labeled in FIG. 6D in order to not clutter the drawing), which openings will later serve as to house the conductive contacts of the package substrate 314 and to provide electrical connections between the metal layers 328 of the metallization stack of the package substrate 314 and the first level interconnects 312.

At 506, a qubit die may be coupled to the package substrate with a patterned superconductor layer provided thereon so that one or more portions of the superconductor face one or more portions of the one or more resonators of the qubit die, as described herein. The qubit die and the interconnects used to couple the qubit die to the package substrate at 506 may take the form of any of the embodiments of the qubit die 304 and the first level interconnects 312 disclosed herein, for example (e.g., any of the embodiments discussed herein with reference to the packages 300). FIG. 6E illustrates an assembly 610 showing a result of implementing the process 506, which illustrated the package 300 as shown in FIG. 3. Various elements shown in FIGS. 6A-6E are not specifically labeled with reference numerals in order to not clutter the drawings, but they are analogous to the elements shown in FIG. 3 and described above. In the interests of brevity, those descriptions are not repeated for FIGS. 6A-6E.

To summarize, various embodiments of superconducting qubit device packages that include a qubit die housing a superconducting qubit device that includes at least one resonator, and a package substrate, each having a first face and an opposing second face have been described. The resonator is disposed on the first face of the qubit die. The first face of the qubit die faces and is attached to the second face of the package substrate by first level interconnects. The second face of the package substrate includes a superconductor facing at least portions of the resonator. Such a package architecture may advantageously allow reducing design complexity and undesired coupling, enable inclusion of larger numbers of qubit devices in the qubit die of the package, reduce potential negative impact of the materials used in the package substrate on resonator performance, and limit some sources of qubit decoherence.

The different views of the quantum circuits and qubit device packages as described herein are shown in the FIGS. with precise right angles and straight lines, which does not reflect example real world process limitations which may cause the features to not look so ideal when any of the structures described above are examined using e.g. scanning electron microscopy (SEM) images or transmission electron microscope (TEM) images. In such images of real structures, possible processing defects could also be visible, such as e.g. tapered vias, occasional screw, edge, or combination dislocations within the crystalline region, occasional dislocation defects of single atoms or clusters of atoms.

Exemplary Qubit Devices

Quantum circuit assemblies, structures, and packages as described above may be included in any kind of qubit devices or quantum processing devices/structures. Some examples of such devices/structures are illustrated in FIGS. 7A-7B, 8, and 9.

Figure 7B:
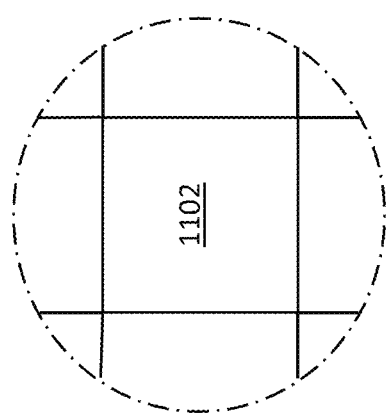
FIGS. 7A and 7B are top views of a wafer and dies that may include any of the qubit devices disclosed herein, in accordance with various embodiments of the present disclosure.
Figure 7A:
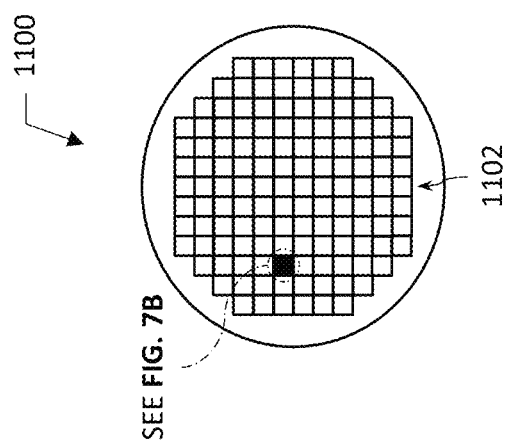

FIGS. 7A-7B are top views of a wafer 1100 and dies 1102 that may be formed from the wafer 1100, according to some embodiments of the present disclosure. The dies 1102 may include any of the qubit devices disclosed herein, e.g., a qubit device of the quantum circuits 100 or 200, any combinations of those circuits, or any further variations of those circuits as described above. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuits 100 or 200 or any further variations or combinations of those circuits, including any supporting conductive circuitry to route electrical signals within the quantum circuits, as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 9) or other logic that is configured to store information in the memory devices or execute instructions stored in the memory array.

Figure 8:
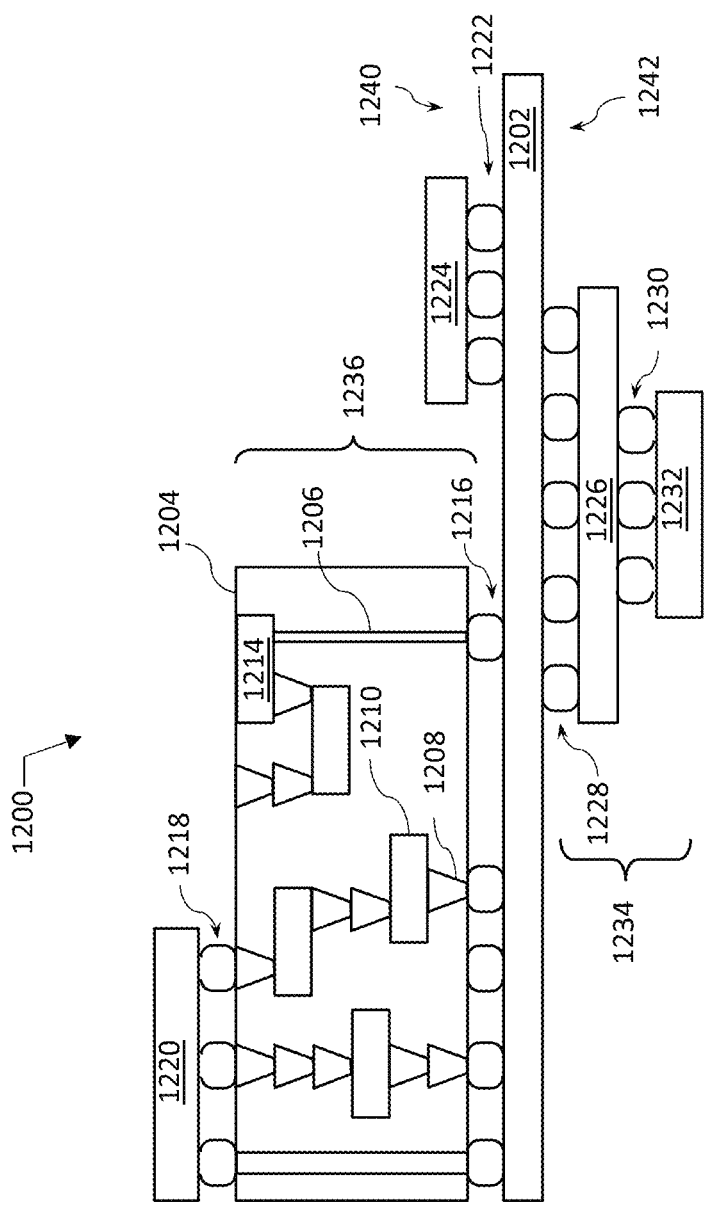
FIG. 8 is a cross-sectional side view of a device assembly that may include any of the qubit device packages disclosed herein, in accordance with various embodiments of the present disclosure.

FIG. 8 is a cross-sectional side view of a device assembly 1200 that may include any of the qubit device packages disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 8 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 8), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 8, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g. a package including any of the qubit devices disclosed herein, e.g., a qubit device of the quantum circuits 100 or 200, any combinations of those circuits, or any further variations of those circuits as described above, or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 8, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including one or more quantum circuits with qubits as described herein or may be a conventional IC package, for example. In some embodiments, the package 1224 may take the form of any of the embodiments of the packages with any of the qubit devices disclosed herein, e.g., a qubit device of the quantum circuits 100 or 200, any combinations of those circuits, or any further variations of those circuits as described above.

The device assembly 1200 illustrated in FIG. 8 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example. In some embodiments, one or both of the packages 1226 and 1232 may take the form of any of the embodiments of the packages with any of the qubit devices disclosed herein, e.g., a qubit device of the quantum circuits 100 or 200, any combinations of those circuits, or any further variations of those circuits as described above.

In some embodiments, any one of the packages 1220, 1224, 1226, or 1232 may include any of the qubit device packages 300 described herein. In other embodiments, any one of the packages 1220, 1224, 1226, or 1232 may include only the qubit die 304 as described herein and be coupled to a corresponding package substrate which may be implemented as the package substrate 314 described herein, using interconnects as described herein, e.g. first level interconnects 312. For example, the qubit die 304 implemented in the package 1220 could be coupled to the interposer 1204 representing the package substrate 314 described herein, with the coupling components 1218 being analogous to the first level interconnects 312 described herein. In another example, the qubit die 304 implemented in the package 1224 could be coupled to the circuit board 1202 representing the package substrate 314 described herein, with the coupling components 1222 being analogous to the first level interconnects 312 described herein. In yet another example, the qubit die 304 implemented in the package 1232 could be coupled to the package 1226 representing the package substrate 314 described herein, with the coupling components 1230 being analogous to the first level interconnects 312 described herein.

Figure 9:
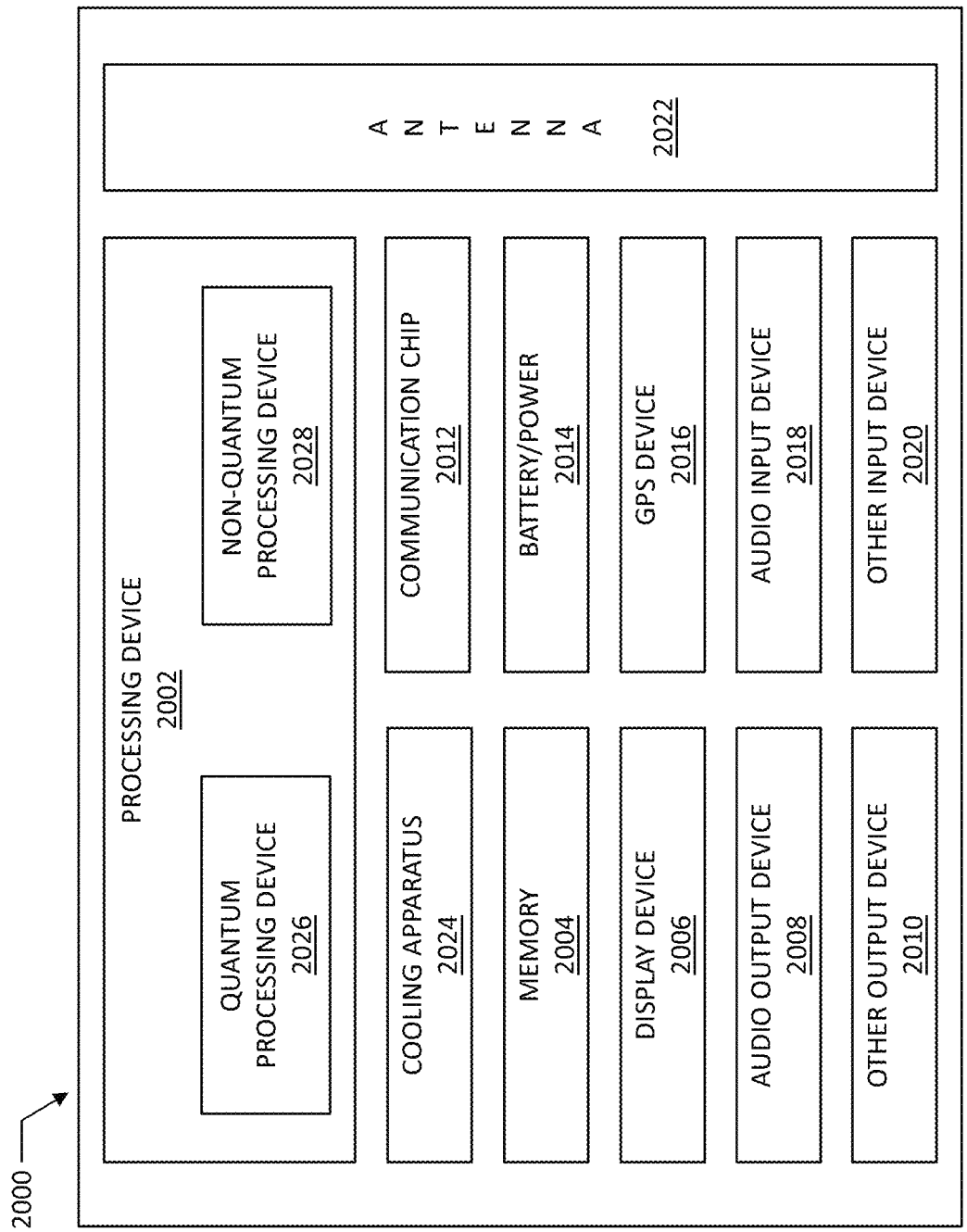
FIG. 9 is a block diagram of an example quantum computing device that may include any of the qubit device packages disclosed herein, in accordance with various embodiments of the present disclosure.

FIG. 9 is a block diagram of an exemplary quantum computing device 2000 that may include any of the qubit device packages disclosed herein. A number of components are illustrated in FIG. 9 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 9, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the qubit device packages with a package substrate with a top superconductor layer as disclosed herein, e.g. any of the packages 300 described herein, and may perform data processing by performing operations on the qubits that may be generated in the quantum circuits implemented in the qubit dies of such packages, e.g. in the qubit die 304, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

SELECT EXAMPLES

The following paragraphs provide some select examples of various ones of the embodiments disclosed herein.

Example 1 provides a superconducting qubit device package that includes a qubit die, a package substrate, and first level interconnects. The qubit die may have a first face and an opposing second face, and may include a superconducting qubit device including one or more superconducting qubits disposed on the first or/and on the second face of the die and at least one resonator disposed at the first face of the qubit die. The package substrate may have a first face and an opposing second face as well. The first level interconnects (e.g. solder bumps) may be disposed between the first face of the qubit die and the second face of the package substrate, electrically coupling conductive contacts at the first face of the qubit die with associated conductive contacts at the second face of the package substrate. The second face of the package substrate may include a superconductor facing at least a portion of the at least one resonator. In other words, at least a portion of an area of the package substrate opposite the at least one resonator may be covered with a superconductor.

Example 2 provides the superconducting qubit device package according to Example 1, where the package substrate includes a metallization stack having a plurality of metal layers in different planes within the package substrate, each pair of metal layers in adjacent planes separated by an insulating layer.

Example 3 provides the superconducting qubit device package according to Example 2, further including a solder mask between portions of the superconductor and portions of a first metal layer of the metallization stack opposite the superconductor, the first metal layer being the metal layer of the metallization stack that is closest to the qubit die. In other words, in some embodiments, a solder mask may be present between the superconductor and the non-superconductive metal of the first metal layer of the package substrate, at least in portions where the superconductor is opposite the non-superconductive metal of the first metal layer.

Example 4 provides the superconducting qubit device package according to Example 3, where the superconductor has a thickness between about 10 and 1000 nanometers, including all values and ranges therein, e.g. between about 50 and 500 nanometers, or between about 100 and 300 nanometers.

Example 5 provides the superconducting qubit device package according to any one of Examples 3-8, where said portions of the first metal layer (i.e. the portions of the first metal layer that are either in contact with the superconductor or are separated from the superconductor by a solder mask) are connected to a ground potential. Thus, the superconductor provided at the second face of the package substrate may act as a continuous ground plane of the superconducting qubit device, the continuous ground plane not having voids under the resonators. This may improve grounding performance of the first level interconnects and help suppress some of the undesired coupled slotline modes.

Example 6 provides the superconducting qubit device package according to Example 2, where the superconductor is in contact with portions of a first metal layer of the metallization stack, the first metal layer being the metal layer of the metallization stack that is closest to the qubit die. In other words, in embodiments alternative to those of Example 3, a solder mask may be absent, and the superconductor and the non-superconductive metal of the first metal layer of the package substrate may be in contact with one another, the first metal layer being the metal layer of the metallization stack that is closest to the qubit die.

Example 7 provides the superconducting qubit device package according to Example 6, where the superconductor includes one or more superconducting materials substantially not wetted by solder.

Example 8 provides the superconducting qubit device package according to Examples 6 or 7, where the superconductor has a thickness between about 10 and 2000 nanometers, including all values and ranges therein, e.g. between about 200 and 800 nanometers, or between about 200 and 400 nanometers.

Example 9 provides the superconducting qubit device package according to any one of Examples 2-8, where at least one first level interconnect coupling a signal conductor of a transmission line of the superconducting qubit device (i.e. a transmission line on, over, or at least partially in the qubit die) to an associated conductive contact at the second face of the package substrate is coupled to a metal layer that is in a plane closest to a plane of a metal layer closest to the qubit die (i.e. is coupled to the metal layer, of the metallization stack, that is second from the surface of the metallization stack closest to the qubit die, i.e. second from the second face of the package substrate). Thus, the signal conductors of transmission lines of the superconducting qubit device may be routed as close to the surface of the package substrate as the second metal layer of the package substrate.

Example 10 provides the superconducting qubit device package according to any one of Examples 2-9, where at least one ground conductor of one or more transmission lines of the superconducting qubit device (i.e. a transmission line on, over, or at least partially in the qubit die) is connected to a ground potential via one or more metal lines in a metal layer of the metallization stack that is closest to the qubit die (i.e. in the first metal layer), and at least one signal conductor of the one or more transmission lines is connected to a signal potential via one or more metal lines in a metal layer of the metallization stack that is closest to and in a different plane from the metal layer that is closest to the qubit line.

Example 11 provides the superconducting qubit device package according to any one of Examples 2-10, where an area of the package substrate opposite the at least one resonator includes one or more metal lines of a metal layer of the metallization stack that is closest to the qubit die (i.e. in the first metal layer).

Example 12 provides the superconducting qubit device package according to Example 11, where the superconductor is provided over or on the one or more metal lines of in said area. Thus, portions of the first metal layer of the metallization stack in areas of the package substrate opposite the resonators do not have to be void when a superconductor is provided over such portions.

Example 13 provides the superconducting qubit device package according to any one of Examples 1-12, where the conductive contacts at the first face of the qubit die are electrically connected to one or more flux bias lines of the superconducting qubit device.

Example 14 provides the superconducting qubit device package according to Example 13, where the first level interconnects and the package substrate are configured to enable provision of current, from a control logic external to the qubit die to the one or more flux bias lines of the qubit die, for tuning a resonant frequency of one or more superconducting qubits of the superconducting qubit device.

Example 15 provides the superconducting qubit device package according to any one of Examples 1-12, where the conductive contacts at the first face of the qubit die are electrically connected to one or more drive lines of the superconducting qubit device.

Example 16 provides the superconducting qubit device package according to Example 15, where the first level interconnects and the package substrate are configured to enable provision of current, from a control logic external to the qubit die to the one or more drive lines of the qubit die, for controlling a quantum state of one or more superconducting qubits of the superconducting qubit device.

Example 17 provides the superconducting qubit device package according to any one of Examples 1-12, where the conductive contacts at the first face of the qubit die are electrically connected to one or more readout lines coupled to the at least one resonator.

Example 18 provides the superconducting qubit device package according to Example 17, where the first level interconnects and the package substrate are configured to enable a control logic external to the qubit die to detect current in the one or more readout lines, for detecting a quantum state of one or more superconducting qubits of the superconducting qubit device.

Example 19 provides the superconducting qubit device package according to any one of the preceding Examples, where the package substrate is an interposer.

Example 20 provides the superconducting qubit device package according to any one of Examples 1-19, where the first level interconnects include a solder, and the solder includes indium.

Example 21 provides the superconducting qubit device package according to any one of Examples 1-19, where the first level interconnects include a solder, and the solder includes bismuth, silver or gallium.

Example 22 provides the superconducting qubit device package according to any one of Examples 1-19, where the first level interconnects include a solder having a melting point that is less than 180 degrees Celsius.

Example 23 provides a method of manufacturing a SC qubit device package, the method including providing a superconductor layer over a metallization stack of a package substrate having a first face and an opposing second face, the superconductor layer patterned to include openings for electrically coupling conductive contacts at the second face of the package substrate to associated conductive contacts at a first face of a qubit die, where the qubit die includes a superconducting qubit device including one or more superconducting qubits disposed at the first face of the die and at least one resonator disposed at the first face of the qubit die; and coupling the qubit die to the package substrate using first level interconnects in the openings in the superconductor layer so that a portion of the superconductor layer faces at least a portion of the at least one resonator and the first level interconnects couple the conductive contacts at the first face of the qubit die with associated conductive contacts at the second face of the package substrate.

Example 24 provides the method according to Example 23, where providing the patterned superconductor layer includes depositing photoresist over the metallization stack of the package substrate in areas designated for the openings, depositing a layer of a superconductor over the package substrate with the photoresist, and removing the photoresist to create the openings in the superconductor layer.

In various further Examples, the method of manufacturing the superconducting qubit device package according to Examples 23 or 24 may further include processes for manufacturing the superconducting qubit device package having features according to any one of the preceding Examples, e.g. any one of Examples 1-22.

Example 25 provides a quantum computing device that includes a quantum processing device including a superconducting qubit device package that includes a qubit die having a plurality of superconducting qubits and a plurality of resonators, and further includes a package substrate attached to the qubit die via first level interconnects; and a memory device configured to store data generated by the plurality of superconducting qubits during operation of the quantum processing device. In the quantum processing device, a surface of the package substrate may include a layer of a superconductor, the plurality of resonators may be disposed on a surface of the qubit die, and the package substrate may be attached to the qubit die so that one or more portions of the superconductor face one or more portions of at least one of the plurality of resonators.

Example 26 provides the quantum computing device according to Example 25, further including a cooling apparatus configured to maintain a temperature of at least portions of the quantum processing device below 5 degrees Kelvin.

Example 27 provides the quantum computing device according to Examples 25 or 26, where the memory device is further configured to store instructions for a quantum computing algorithm to be executed by the quantum processing device.

Example 28 provides the quantum computing device according to any one of Examples 25-27, further including a non-quantum processing device coupled to the quantum processing device.

Example 29 provides the quantum computing device according to Example 28, where the non-quantum processing device is coupled to the quantum processing device at least partially via the package substrate and configured to control signals applied to the plurality of superconducting qubits or/and the plurality of resonators.

In various further Examples, the superconducting qubit device package of the quantum processing device of the quantum computing device according to any one of Examples 25-29 may be implemented as the superconducting qubit device package according to any one of the preceding Examples, e.g. any one of Examples 1-22.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A superconducting qubit device package, comprising:
    a qubit die having a first face and an opposing second face, wherein the qubit die includes a superconducting qubit device comprising at least one resonator at the first face of the qubit die,
    a package substrate having a first face and an opposing second face; and
    first level interconnects, coupling conductive contacts at the first face of the qubit die with associated conductive contacts at the second face of the package substrate,
    wherein the second face of the package substrate includes a superconductor facing at least a portion of the at least one resonator.

2. The superconducting qubit device package according to claim 1, wherein the package substrate includes a metallization stack having a plurality of metal layers in different planes within the package substrate, each pair of metal layers in adjacent planes separated by an insulating layer.

3. The superconducting qubit device package according to claim 2, further including a solder mask between portions of the superconductor and portions of a first metal layer of the metallization stack.

4. The superconducting qubit device package according to claim 3, wherein the superconductor has a thickness between 10 and 1000 nanometers.

5. The superconducting qubit device package according to claim 3, wherein said portions of the first metal layer are connected to a ground potential.

6. The superconducting qubit device package according to claim 2, wherein the superconductor is in contact with portions of a first metal layer of the metallization stack.

7. The superconducting qubit device package according to claim 6, wherein the superconductor comprises one or more superconducting materials substantially not wetted by solder.

8. The superconducting qubit device package according to claim 6, wherein the superconductor has a thickness between 10 and 2000 nanometers.

9. The superconducting qubit device package according to claim 2, wherein at least one first level interconnect coupling a signal conductor of a transmission line of the superconducting qubit device to an associated conductive contact at the second face of the package substrate is coupled to a metal layer that is in a plane closest to a plane of a metal layer closest to the qubit die.

10. The superconducting qubit device package according to claim 2, wherein at least one ground conductor of one or more transmission lines of the superconducting qubit device is connected to a ground potential via one or more metal lines in a metal layer of the metallization stack that is closest to the qubit die, and at least one signal conductor of the one or more transmission lines is connected to a signal potential via one or more metal lines in a metal layer of the metallization stack that is closest to and in a different plane from the metal layer that is closest to the qubit line.

11. The superconducting qubit device package according to claim 2, wherein an area of the package substrate opposite the at least one resonator includes one or more metal lines of a metal layer of the metallization stack that is closest to the qubit die.

12. The superconducting qubit device package according to claim 11, wherein the superconductor is over or on the one or more metal lines in said area.

13. The superconducting qubit device package according to claim 1, wherein the conductive contacts at the first face of the qubit die are connected to one or more flux bias lines of the superconducting qubit device.

14. The superconducting qubit device package according to claim 13, wherein the first level interconnects are configured to enable provision of current, from a control logic to the one or more flux bias lines of the qubit die, for tuning a resonant frequency of one or more superconducting qubits of the superconducting qubit device.

15. The superconducting qubit device package according to claim 1, wherein the conductive contacts at the first face of the qubit die are connected to one or more drive lines of the superconducting qubit device.

16. The superconducting qubit device package according to claim 15, wherein the first level interconnects are configured to enable provision of current, from a control logic to the one or more drive lines of the qubit die, for controlling a quantum state of one or more superconducting qubits of the superconducting qubit device.

17. The superconducting qubit device package according to claim 1, wherein the conductive contacts at the first face of the qubit die are coupled to one or more readout lines coupled to the at least one resonator, and wherein the first level interconnects are configured to enable a control logic to detect current in the one or more readout lines, the current being indicative of a quantum state of one or more superconducting qubits of the superconducting qubit device.

18. The superconducting qubit device package according to claim 1, wherein the first level interconnects include a solder, and the solder includes indium, bismuth, silver or gallium.

19. The superconducting qubit device package according to claim 1, wherein the first level interconnects include a solder having a melting point that is less than 180 degrees Celsius.

20. The superconducting qubit device package according to claim 1, wherein the superconductor is at a ground potential during operation of the superconducting qubit device.

21. The superconducting qubit device package according to claim 1, wherein the superconductor includes a continuous layer of a superconductive material opposite the at least one resonator.

22. The superconducting qubit device package according to claim 1, wherein the package substrate includes a metallization stack having a plurality of metal layers in different planes within the package substrate, each of the different planes being parallel to the first face or the second face of the package substrate, each pair of metal layers in adjacent planes separated by an insulating layer.

23. A superconducting qubit device package, comprising:
- a qubit die having a first face and an opposing second face, wherein the qubit die includes a superconducting qubit device comprising at least one resonator at the first face of the qubit die,
- a package substrate having a first face and an opposing second face; and
- first level interconnects, coupling conductive contacts at the first face of the qubit die with associated conductive contacts at the second face of the package substrate, the first level interconnects including a solder, where the solder includes one or more of indium, bismuth, silver or gallium,
- wherein the second face of the package substrate includes a superconductor facing at least a portion of the at least one resonator.

24. A quantum computing device, comprising:
- a quantum processing device including a superconducting qubit device package that includes a qubit die having a first face and an opposing second face, wherein the qubit die includes at least one superconducting qubit device comprising at least one resonator at the first face of the qubit die; and
- a memory device configured to store data generated by the at least one superconducting qubit device during operation of the quantum processing device,
- wherein:
  - the superconducting qubit device package further includes a package substrate having a first face and an opposing second face, and
  - the second face of the package substrate includes a superconductor facing at least a portion of the at least one resonator.

25. The quantum computing device according to claim 24, wherein the superconductor is at a ground potential during operation of the quantum processing device.

* * * * *